(12) United States Patent
Drzaic et al.

(10) Patent No.: US 8,466,852 B2
(45) Date of Patent: Jun. 18, 2013

(54) FULL COLOR REFLECTIVE DISPLAY WITH MULTICHROMATIC SUB-PIXELS

(75) Inventors: Paul Drzaic, Lexington, MA (US); Russell J. Wilcox, Natick, MA (US)

(73) Assignee: E Ink Corporation, Cambridge, MA (US)

( * ) Notice: Subject to any disclaimer, the term of this patent is extended or adjusted under 35 U.S.C. 154(b) by 1946 days.

(21) Appl. No.: 10/827,745

(22) Filed: Apr. 20, 2004

(65) Prior Publication Data
US 2004/0263947 A1    Dec. 30, 2004

Related U.S. Application Data

(63) Continuation of application No. 09/289,507, filed on Apr. 9, 1999, now Pat. No. 7,075,502.

(60) Provisional application No. 60/081,362, filed on Apr. 10, 1998.

(51) Int. Cl.
G09G 3/34 (2006.01)
G09G 3/20 (2006.01)

(52) U.S. Cl.
USPC ............................................. 345/55; 259/296

(58) Field of Classification Search
USPC . 345/107, 55; 359/296; 349/86, 89; 204/600, 204/602
See application file for complete search history.

(56) References Cited

U.S. PATENT DOCUMENTS

| | | | |
|---|---|---|---|
| 2,766,478 A | 10/1956 | Raley et al. | |
| 3,036,388 A | 5/1962 | Tate | |
| 3,384,488 A | 5/1968 | Tulagin et al. | |
| 3,389,194 A | 6/1968 | Somerville | |
| 3,406,363 A | 10/1968 | Tate | |
| 3,423,489 A | 1/1969 | Arens et al. | |
| 3,460,248 A | 8/1969 | Tate | |
| 3,585,381 A | 6/1971 | Hodson et al. | |
| 3,612,758 A | 10/1971 | Evans et al. | |
| 3,617,374 A | 11/1971 | Hodson et al. | |
| 3,668,106 A | 6/1972 | Ota | |
| 3,670,323 A | 6/1972 | Sobel et al. | |
| 3,756,693 A | 9/1973 | Ota | |
| 3,767,392 A | 10/1973 | Ota | |
| 3,772,013 A | 11/1973 | Wells | |

(Continued)

FOREIGN PATENT DOCUMENTS

| | | |
|---|---|---|
| CH | 563 807 | 7/1975 |
| DE | 195 00 694 A1 | 1/1995 |

(Continued)

OTHER PUBLICATIONS

Performing Pixels: Moving Images on Electronic Paper; Sep. 25, 2003; pp. 329-433; Nature Highlighs; vol. 425 No. 6956.

(Continued)

Primary Examiner — Jimmy H Nguyen
(74) Attorney, Agent, or Firm — David J. Cole

(57) ABSTRACT

A full color, reflective display having superior saturation and brightness is achieved with a novel display element comprising multichromatic elements. In one embodiment a capsule includes more than three species of particles which differ visually. One embodiment of the display employs three sub-pixels, each sub-pixel comprising a capsule including three species of particles which differ visually. Another embodiment of the display employs color filters to provide different visual states to the user. The display element presents a visual display in response to the application of an electrical signal to at least one of the capsules.

8 Claims, 14 Drawing Sheets

U.S. PATENT DOCUMENTS

| | | |
|---|---|---|
| 3,792,308 A | 2/1974 | Ota |
| 3,850,627 A | 11/1974 | Wells et al. |
| 3,870,517 A | 3/1975 | Ota et al. |
| 3,892,568 A | 7/1975 | Ota |
| 3,909,116 A | 9/1975 | Kohashi |
| 3,936,816 A | 2/1976 | Murata |
| 3,959,906 A | 6/1976 | Norris, Jr. et al. |
| 3,972,040 A | 7/1976 | Hilsum et al. |
| 4,041,481 A | 8/1977 | Sato |
| 4,045,327 A | 8/1977 | Noma |
| 4,056,708 A | 11/1977 | Soodak et al. |
| 4,062,009 A | 12/1977 | Raverdy et al. |
| 4,068,927 A | 1/1978 | White |
| 4,071,430 A | 1/1978 | Liebert |
| 4,088,395 A | 5/1978 | Gigila |
| 4,093,534 A | 6/1978 | Carter et al. |
| 4,104,520 A | 8/1978 | Lewis et al. |
| 4,123,206 A | 10/1978 | Dannelly |
| 4,123,346 A | 10/1978 | Ploix |
| 4,126,528 A | 11/1978 | Chiang |
| 4,126,854 A | 11/1978 | Sheridon |
| 4,143,103 A | 3/1979 | Sheridon |
| 4,143,472 A | 3/1979 | Murata et al. |
| 4,147,932 A | 4/1979 | Lewis |
| 4,149,149 A | 4/1979 | Miki et al. |
| 4,185,621 A | 1/1980 | Morrow |
| 4,196,437 A | 4/1980 | Hertz |
| 4,203,106 A | 5/1980 | Dalisa et al. |
| 4,218,302 A | 8/1980 | Dalisa et al. |
| 4,231,641 A | 11/1980 | Randin |
| 4,251,747 A | 2/1981 | Burdick |
| 4,261,653 A | 4/1981 | Goodrich |
| 4,272,596 A | 6/1981 | Harbour et al. |
| 4,279,632 A | 7/1981 | Frosch et al. |
| 4,285,801 A | 8/1981 | Chiang |
| 4,298,448 A | 11/1981 | Muller et al. |
| 4,301,407 A | 11/1981 | Koslar |
| 4,303,433 A | 12/1981 | Torobin |
| 4,305,807 A | 12/1981 | Somlyody |
| 4,311,361 A | 1/1982 | Somlyody |
| 4,314,013 A | 2/1982 | Chang |
| 4,324,456 A | 4/1982 | Dalisa |
| 4,336,536 A | 6/1982 | Kalt et al. |
| 4,345,249 A | 8/1982 | Togashi |
| 4,368,952 A | 1/1983 | Murata et al. |
| 4,373,282 A | 2/1983 | Wragg |
| 4,390,403 A | 6/1983 | Batchelder |
| 4,418,346 A | 11/1983 | Batchelder |
| 4,430,648 A | 2/1984 | Togashi et al. |
| 4,435,047 A | 3/1984 | Fergason |
| 4,438,160 A | 3/1984 | Ishikawa et al. |
| 4,450,440 A | 5/1984 | White |
| 4,453,200 A | 6/1984 | Trcka et al. |
| 4,500,880 A | 2/1985 | Gomersall et al. |
| 4,502,934 A | 3/1985 | Gazard et al. |
| 4,509,828 A | 4/1985 | Clerc et al. |
| 4,522,472 A | 6/1985 | Liebert et al. |
| 4,544,834 A | 10/1985 | Newport et al. |
| 4,598,960 A | 7/1986 | DiSanto et al. |
| 4,605,284 A | 8/1986 | Fergason |
| 4,606,611 A | 8/1986 | Fergason |
| 4,616,903 A | 10/1986 | Fergason |
| 4,620,916 A | 11/1986 | Zwemer et al. |
| 4,640,583 A | 2/1987 | Hoshikawa et al. |
| 4,643,528 A | 2/1987 | Bell, Jr. |
| 4,648,956 A | 3/1987 | Marshall et al. |
| 4,655,897 A | 4/1987 | DiSanto et al. |
| 4,684,219 A | 8/1987 | Cox et al. |
| 4,686,524 A | 8/1987 | White |
| 4,700,183 A | 10/1987 | White |
| 4,703,573 A | 11/1987 | Montgomery et al. |
| 4,707,080 A | 11/1987 | Fergason |
| 4,707,593 A | 11/1987 | Murata et al. |
| 4,726,662 A | 2/1988 | Cromack |
| 4,730,186 A | 3/1988 | Koga et al. |
| 4,732,456 A | 3/1988 | Fergason et al. |
| 4,732,830 A | 3/1988 | DiSanto et al. |
| 4,741,601 A | 5/1988 | Saito |
| 4,741,604 A | 5/1988 | Kornfeld |
| 4,742,345 A | 5/1988 | Di Santo et al. |
| 4,746,917 A | 5/1988 | Di Santo et al. |
| 4,748,366 A | 5/1988 | Taylor |
| 4,772,102 A | 9/1988 | Fergason et al. |
| 4,772,820 A | 9/1988 | DiSanto et al. |
| 4,776,675 A | 10/1988 | Takaochi et al. |
| 4,789,858 A | 12/1988 | Fergason et al. |
| 4,794,390 A | 12/1988 | Lippman |
| 4,821,291 A | 4/1989 | Stevens et al. |
| 4,824,208 A | 4/1989 | Fergason et al. |
| 4,832,458 A | 5/1989 | Fergason et al. |
| 4,833,464 A | 5/1989 | Di Santo et al. |
| 4,850,919 A | 7/1989 | DiSanto et al. |
| 4,870,677 A | 9/1989 | Di Santo et al. |
| 4,888,140 A | 12/1989 | Schlameus et al. |
| 4,889,603 A | 12/1989 | DiSanto et al. |
| 4,891,245 A | 1/1990 | Micale |
| 4,892,607 A | 1/1990 | DiSanto et al. |
| 4,909,959 A | 3/1990 | Lemaire et al. |
| 4,919,521 A | 4/1990 | Tada et al. |
| 4,931,019 A | 6/1990 | Park |
| 4,937,586 A | 6/1990 | Stevens et al. |
| 4,947,157 A | 8/1990 | Di Santo et al. |
| 4,947,159 A | 8/1990 | Di Santo et al. |
| 4,947,219 A | 8/1990 | Boehm |
| 4,948,232 A | 8/1990 | Lange |
| 4,949,081 A | 8/1990 | Keller et al. |
| 4,960,351 A | 10/1990 | Kendall, Jr. et al. |
| 4,962,466 A | 10/1990 | Revesz et al. |
| 5,006,212 A | 4/1991 | DiSanto et al. |
| 5,006,422 A | 4/1991 | Sakurai et al. |
| 5,009,490 A | 4/1991 | Kouno et al. |
| 5,016,002 A | 5/1991 | Levanto |
| 5,017,225 A | 5/1991 | Nakanishi et al. |
| 5,028,841 A | 7/1991 | DiSanto et al. |
| 5,040,960 A | 8/1991 | Shioya et al. |
| 5,041,824 A | 8/1991 | DiSanto et al. |
| 5,042,917 A | 8/1991 | Fujita et al. |
| 5,053,763 A | 10/1991 | DiSanto et al. |
| 5,057,363 A | 10/1991 | Nakanishi |
| 5,066,105 A | 11/1991 | Yoshimoto et al. |
| 5,066,946 A | 11/1991 | DiSanto et al. |
| 5,067,021 A | 11/1991 | Brody |
| 5,070,326 A | 12/1991 | Yoshimoto et al. |
| 5,077,157 A | 12/1991 | DiSanto et al. |
| 5,082,351 A | 1/1992 | Fergason |
| 5,105,185 A | 4/1992 | Nakanowatari et al. |
| 5,128,785 A | 7/1992 | Yoshimoto et al. |
| 5,138,472 A | 8/1992 | Jones et al. |
| 5,148,002 A | 9/1992 | Kuo et al. |
| 5,151,032 A | 9/1992 | Igawa |
| 5,155,607 A | 10/1992 | Inoue et al. |
| 5,160,371 A | 11/1992 | Ito |
| 5,161,007 A | 11/1992 | Takanashi et al. |
| 5,167,508 A | 12/1992 | Mc Taggart |
| 5,172,314 A | 12/1992 | Poland et al. |
| 5,174,882 A | 12/1992 | DiSanto et al. |
| 5,175,047 A | 12/1992 | McKenney et al. |
| 5,177,476 A | 1/1993 | DiSanto et al. |
| 5,179,065 A | 1/1993 | Ito |
| 5,185,226 A | 2/1993 | Grosso et al. |
| 5,187,609 A | 2/1993 | DiSanto et al. |
| 5,194,852 A | 3/1993 | More et al. |
| 5,208,686 A | 5/1993 | Fergason |
| 5,216,416 A | 6/1993 | DiSanto et al. |
| 5,220,316 A | 6/1993 | Kazan |
| 5,223,115 A | 6/1993 | DiSanto et al. |
| 5,223,823 A | 6/1993 | DiSanto et al. |
| 5,233,459 A | 8/1993 | Bozler et al. |
| 5,238,861 A | 8/1993 | Morin et al. |
| 5,247,290 A | 9/1993 | Di Santo et al. |
| 5,250,932 A | 10/1993 | Yoshimoto et al. |
| 5,250,938 A | 10/1993 | DiSanto et al. |
| 5,254,981 A | 10/1993 | Disanto et al. |
| 5,258,864 A | 11/1993 | Shannon |
| 5,260,002 A | 11/1993 | Wang |
| 5,262,098 A | 11/1993 | Crowley et al. |
| 5,266,934 A | 11/1993 | Van Almen |

| | | |
|---|---|---|
| 5,266,937 A | 11/1993 | DiSanto et al. |
| 5,270,843 A | 12/1993 | Wang |
| 5,276,438 A | 1/1994 | DiSanto et al. |
| 5,279,511 A | 1/1994 | DiSanto et al. |
| 5,279,694 A | 1/1994 | DiSanto et al. |
| 5,293,528 A | 3/1994 | DiSanto et al. |
| 5,298,833 A | 3/1994 | Hou |
| 5,302,235 A | 4/1994 | DiSanto et al. |
| 5,303,073 A | 4/1994 | Shirota et al. |
| 5,304,439 A | 4/1994 | DiSanto et al. |
| 5,315,312 A | 5/1994 | DiSanto et al. |
| 5,344,594 A | 9/1994 | Sheridon |
| 5,345,251 A | 9/1994 | DiSanto et al. |
| 5,345,322 A | 9/1994 | Fergason |
| 5,357,355 A | 10/1994 | Arai |
| 5,359,346 A | 10/1994 | DiSanto et al. |
| 5,360,689 A | 11/1994 | Hou et al. |
| 5,362,671 A | 11/1994 | Zavracky et al. |
| 5,374,815 A | 12/1994 | Waterhouse et al. |
| 5,380,362 A | 1/1995 | Schubert |
| 5,389,945 A | 2/1995 | Sheridon |
| 5,398,131 A | 3/1995 | Hall et al. |
| 5,402,145 A | 3/1995 | DiSanto et al. |
| 5,403,518 A | 4/1995 | Schubert |
| 5,407,231 A | 4/1995 | Schwartz |
| 5,411,398 A | 5/1995 | Nakanishi et al. |
| 5,411,656 A | 5/1995 | Schubert |
| 5,412,398 A | 5/1995 | DiSanto et al. |
| 5,421,926 A | 6/1995 | Yukinobu et al. |
| 5,430,462 A | 7/1995 | Katagiri |
| 5,450,069 A | 9/1995 | DiSanto et al. |
| 5,459,776 A | 10/1995 | Di Santo et al. |
| 5,460,688 A | 10/1995 | DiSanto et al. |
| 5,463,492 A | 10/1995 | Check, III |
| 5,467,107 A | 11/1995 | DiSanto et al. |
| 5,485,176 A | 1/1996 | Ohara et al. |
| 5,490,005 A | 2/1996 | Jueliger |
| 5,497,171 A | 3/1996 | Teres et al. |
| 5,498,674 A | 3/1996 | Hou et al. |
| 5,499,038 A | 3/1996 | DiSanto et al. |
| 5,500,635 A | 3/1996 | Mott |
| 5,508,068 A | 4/1996 | Nakano |
| 5,508,720 A | 4/1996 | DiSanto et al. |
| 5,512,162 A | 4/1996 | Sachs et al. |
| 5,528,399 A | 6/1996 | Izumi et al. |
| 5,530,567 A | 6/1996 | Takei |
| 5,534,888 A | 7/1996 | Lebby et al. |
| 5,538,430 A | 7/1996 | Smith et al. |
| 5,541,478 A | 7/1996 | Troxell et al. |
| 5,543,219 A | 8/1996 | Elwakil |
| 5,548,282 A | 8/1996 | Escritt et al. |
| 5,561,443 A | 10/1996 | DiSanto et al. |
| 5,565,885 A | 10/1996 | Tamanoi |
| 5,571,741 A | 11/1996 | Leedy |
| 5,573,711 A | 11/1996 | Hou et al. |
| 5,574,291 A | 11/1996 | Dodabalapur et al. |
| 5,575,554 A | 11/1996 | Guritz |
| 5,576,867 A | 11/1996 | Baur et al. |
| 5,582,700 A | 12/1996 | Bryning et al. |
| 5,583,675 A | 12/1996 | Yamada et al. |
| 5,596,208 A | 1/1997 | Dodabalapur et al. |
| 5,600,172 A | 2/1997 | McDevitt et al. |
| 5,602,572 A | 2/1997 | Rylander |
| 5,604,027 A | 2/1997 | Sheridon |
| 5,609,978 A | 3/1997 | Giorgianni et al. |
| 5,614,427 A | 3/1997 | den Boer et al. |
| 5,619,307 A | 4/1997 | Machino et al. |
| 5,625,460 A | 4/1997 | Tai |
| 5,627,561 A | 5/1997 | Laspina et al. |
| 5,635,317 A | 6/1997 | Taniguchi et al. |
| 5,638,103 A | 6/1997 | Obata et al. |
| 5,639,914 A | 6/1997 | Tomiyama et al. |
| 5,641,974 A | 6/1997 | den Boer et al. |
| 5,643,673 A | 7/1997 | Hou |
| 5,648,801 A | 7/1997 | Beardsley et al. |
| 5,649,266 A | 7/1997 | Rushing |
| 5,650,199 A | 7/1997 | Chang et al. |
| 5,650,247 A | 7/1997 | Taniguchi et al. |
| 5,650,872 A | 7/1997 | Saxe et al. |
| 5,663,739 A | 9/1997 | Pommerenke et al. |
| 5,672,381 A | 9/1997 | Rajan |
| 5,684,501 A | 11/1997 | Knapp et al. |
| 5,686,383 A | 11/1997 | Long et al. |
| 5,689,282 A | 11/1997 | Wolfs et al. |
| 5,694,224 A | 12/1997 | Tai |
| 5,699,097 A | 12/1997 | Takayama et al. |
| 5,699,102 A | 12/1997 | Ng et al. |
| 5,705,826 A | 1/1998 | Aratani et al. |
| 5,707,738 A | 1/1998 | Hou |
| 5,707,747 A | 1/1998 | Tomiyama et al. |
| 5,708,525 A | 1/1998 | Sheridon |
| 5,709,976 A | 1/1998 | Malhotra |
| 5,714,051 A | 2/1998 | Van Leth et al. |
| 5,715,026 A | 2/1998 | Shannon |
| 5,715,514 A | 2/1998 | Williams et al. |
| 5,716,550 A | 2/1998 | Gardner et al. |
| 5,717,283 A | 2/1998 | Biegelsen et al. |
| 5,717,514 A | 2/1998 | Sheridon |
| 5,717,515 A | 2/1998 | Sheridon |
| 5,721,042 A | 2/1998 | Iijima et al. |
| 5,722,781 A | 3/1998 | Yamaguchi |
| 5,725,935 A | 3/1998 | Rajan |
| 5,731,116 A | 3/1998 | Matsuo et al. |
| 5,737,115 A | 4/1998 | Mackinlay et al. |
| 5,738,176 A | 4/1998 | Gingerich |
| 5,738,716 A | 4/1998 | Santilli et al. |
| 5,738,977 A | 4/1998 | Van Der Sluis-Van Der Voort et al. |
| 5,739,801 A | 4/1998 | Sheridon |
| 5,742,879 A | 4/1998 | Altrieth, III |
| 5,744,283 A | 4/1998 | Spierings et al. |
| 5,745,094 A | 4/1998 | Gordon, II et al. |
| 5,750,238 A | 5/1998 | Iijima et al. |
| 5,751,257 A | 5/1998 | Sutherland |
| 5,751,268 A | 5/1998 | Sheridon |
| 5,751,433 A | 5/1998 | Narendranath et al. |
| 5,751,434 A | 5/1998 | Narendranath et al. |
| 5,752,152 A | 5/1998 | Gasper et al. |
| 5,754,332 A | 5/1998 | Crowley |
| 5,759,671 A | 6/1998 | Tanaka et al. |
| 5,760,761 A | 6/1998 | Sheridon |
| 5,767,826 A | 6/1998 | Sheridon et al. |
| 5,767,978 A | 6/1998 | Revankar et al. |
| 5,777,782 A | 7/1998 | Sheridon |
| 5,783,614 A | 7/1998 | Chen et al. |
| 5,786,875 A | 7/1998 | Brader et al. |
| 5,801,664 A | 9/1998 | Seidensticker et al. |
| 5,808,783 A | 9/1998 | Crowley |
| 5,815,306 A | 9/1998 | Sheridon et al. |
| 5,825,529 A | 10/1998 | Crowley |
| 5,828,432 A | 10/1998 | Shashidhar et al. |
| 5,835,577 A | 11/1998 | Disanto et al. |
| 5,843,259 A | 12/1998 | Narang et al. |
| 5,872,552 A | 2/1999 | Gordon, II et al. |
| 5,874,746 A | 2/1999 | Holmberg et al. |
| 5,880,705 A | 3/1999 | Onyskevych et al. |
| 5,892,244 A | 4/1999 | Tanaka et al. |
| 5,892,504 A | 4/1999 | Knapp |
| 5,894,367 A | 4/1999 | Sheridon |
| 5,900,858 A | 5/1999 | Richley |
| 5,914,698 A | 6/1999 | Nicholson et al. |
| 5,914,806 A | 6/1999 | Gordon, II et al. |
| 5,917,199 A | 6/1999 | Byun et al. |
| 5,922,268 A | 7/1999 | Sheridon |
| 5,930,026 A | 7/1999 | Jacobson et al. |
| 5,958,169 A | 9/1999 | Titterington et al. |
| 5,961,804 A | 10/1999 | Jacobson et al. |
| 5,963,456 A | 10/1999 | Klein et al. |
| 5,972,493 A | 10/1999 | Iwasaki et al. |
| 5,975,680 A | 11/1999 | Wen et al. |
| 5,978,052 A | 11/1999 | Ilcisin et al. |
| 5,982,346 A | 11/1999 | Sheridon et al. |
| 5,986,622 A | 11/1999 | Ong |
| 5,989,945 A | 11/1999 | Yudasaka et al. |
| 6,014,247 A | 1/2000 | Winter et al. |
| 6,017,584 A | 1/2000 | Albert et al. |
| 6,025,896 A | 2/2000 | Hattori et al. |
| 6,045,955 A | 4/2000 | Vincent |

| | | | | | | |
|---|---|---|---|---|---|---|
| 6,051,957 | A | 4/2000 | Klein | EP | 0 325 013 A1 | 7/1989 |
| 6,055,091 | A | 4/2000 | Sheridon | EP | 0 325 013 B1 | 7/1989 |
| 6,064,091 | A | 5/2000 | Deane et al. | EP | 0 344 367 A1 | 12/1989 |
| 6,064,784 | A | 5/2000 | Whitehead et al. | EP | 0 344 367 B1 | 12/1989 |
| 6,067,185 | A | 5/2000 | Albert et al. | EP | 0 361 420 A2 | 4/1990 |
| 6,076,094 | A | 6/2000 | Cohen et al. | EP | 0 362 928 A1 | 4/1990 |
| 6,097,531 | A | 8/2000 | Sheridon | EP | 0 363 030 A2 | 4/1990 |
| 6,105,290 | A | 8/2000 | Coates et al. | EP | 0 363 030 B1 | 4/1990 |
| 6,107,117 | A | 8/2000 | Bao et al. | EP | 0 390 303 A2 | 10/1990 |
| 6,113,810 | A | 9/2000 | Hou et al. | EP | 0 396 247 81 | 11/1990 |
| 6,117,294 | A | 9/2000 | Rasmussen | EP | 0 396 247 A2 | 11/1990 |
| 6,117,368 | A | 9/2000 | Hou | EP | 0 404 545 A2 | 12/1990 |
| 6,118,426 | A | 9/2000 | Albert et al. | EP | 0 417 362 A1 | 3/1991 |
| 6,120,588 | A | 9/2000 | Jacobson | EP | 0 417 362 B1 | 3/1991 |
| 6,120,839 | A | 9/2000 | Comiskey et al. | EP | 0 442 123 A1 | 8/1991 |
| 6,124,851 | A | 9/2000 | Jacobson | EP | 0 443 571 A2 | 8/1991 |
| 6,130,773 | A | 10/2000 | Jacobson et al. | EP | 0 448 853 A1 | 10/1991 |
| 6,130,774 | A | 10/2000 | Albert et al. | EP | 0 448 853 B1 | 10/1991 |
| 6,137,467 | A | 10/2000 | Sheridon et al. | EP | 0 460 747 A2 | 12/1991 |
| 6,140,980 | A | 10/2000 | Spitzer et al. | EP | 0 240 063 B1 | 1/1992 |
| 6,144,361 | A | 11/2000 | Gordon, II et al. | EP | 0 525 852 A1 | 2/1993 |
| 6,146,716 | A | 11/2000 | Narang | EP | 0 525 852 B1 | 2/1993 |
| 6,153,075 | A | 11/2000 | Nemelka | EP | 0 540 281 A2 | 5/1993 |
| 6,171,464 | B1 | 1/2001 | Chadha | EP | 0 555 982 | 8/1993 |
| 6,172,798 | B1 | 1/2001 | Albert et al. | EP | 0 555 982 A1 | 8/1993 |
| 6,177,921 | B1 | 1/2001 | Comiskey et al. | EP | 0 555 982 B1 | 8/1993 |
| 6,184,856 | B1 | 2/2001 | Gordon, II et al. | EP | 0 570 995 A1 | 11/1993 |
| 6,198,809 | B1 | 3/2001 | Disanto et al. | EP | 0 570 995 B1 | 11/1993 |
| 6,215,920 | B1 | 4/2001 | Whitehead et al. | EP | 0 575 475 B1 | 12/1993 |
| 6,219,160 | B1 | 4/2001 | Nordal et al. | EP | 0 585 000 | 3/1994 |
| 6,225,971 | B1 | 5/2001 | Gordon, II et al. | EP | 0 585 000 A2 | 3/1994 |
| 6,232,950 | B1 | 5/2001 | Albert et al. | EP | 0 585 000 A3 | 3/1994 |
| 6,239,896 | B1 | 5/2001 | Ikeda | EP | 0 586 373 B1 | 3/1994 |
| 6,249,271 | B1 | 6/2001 | Albert et al. | EP | 0 586 545 81 | 3/1994 |
| 6,252,564 | B1 | 6/2001 | Albert et al. | EP | 0 595 812 B1 | 5/1994 |
| 6,262,706 | B1 | 7/2001 | Albert et al. | EP | 0 600 878 B1 | 6/1994 |
| 6,262,833 | B1 | 7/2001 | Loxley et al. | EP | 0 601 072 B1 | 6/1994 |
| 6,266,113 | B1 | 7/2001 | Yamazaki et al. | EP | 0 601 075 B1 | 6/1994 |
| 6,271,823 | B1 | 8/2001 | Gordon, II et al. | EP | 0 604 423 B1 | 7/1994 |
| 6,274,412 | B1 | 8/2001 | Kydd et al. | EP | 0 618 715 A1 | 10/1994 |
| 6,287,899 | B1 | 9/2001 | Park et al. | EP | 0 622 721 A1 | 11/1994 |
| 6,300,932 | B1 | 10/2001 | Albert | EP | 0 684 579 A2 | 11/1995 |
| 6,310,665 | B1 | 10/2001 | Kido | EP | 0 685 101 B1 | 12/1995 |
| 6,312,304 | B1 | 11/2001 | Duthaler et al. | EP | 0 709 713 A2 | 5/1996 |
| 6,312,971 | B1 | 11/2001 | Amundson et al. | EP | 0708 798 B1 | 5/1996 |
| 6,323,989 | B1 | 11/2001 | Jacobson et al. | EP | 0 717 446 A2 | 6/1996 |
| 6,327,072 | B1 | 12/2001 | Comiskey et al. | EP | 0 721 176 A2 | 7/1996 |
| 6,340,958 | B1 | 1/2002 | Cantu et al. | EP | 0 721 176 A3 | 7/1996 |
| 6,348,908 | B1 | 2/2002 | Richley et al. | EP | 0 778 083 A1 | 6/1997 |
| 6,353,746 | B1 | 3/2002 | Javitt | EP | 0 889 425 A1 | 1/1999 |
| 6,376,828 | B1 | 4/2002 | Comiskey | EP | 0 717 446 A3 | 2/1999 |
| 6,377,387 | B1 | 4/2002 | Duthaler et al. | EP | 0 899 651 A2 | 3/1999 |
| 6,392,785 | B1 | 5/2002 | Albert et al. | EP | 0 924 551 A1 | 6/1999 |
| 6,413,790 | B1 | 7/2002 | Duthaler et al. | EP | 0 930 641 A2 | 7/1999 |
| 6,422,687 | B1 | 7/2002 | Jacobson | EP | 0 962 808 A2 | 12/1999 |
| 6,438,882 | B1 | 8/2002 | Reynolds | EP | 0 708 798 B1 | 4/2000 |
| 6,445,374 | B2 | 9/2002 | Albert et al. | EP | 1 000 741 A2 | 5/2000 |
| 6,459,418 | B1 | 10/2002 | Comiskey et al. | EP | 1 024 540 A2 | 8/2000 |
| 6,473,072 | B1 | 10/2002 | Comiskey et al. | EP | 1 089 118 A2 | 4/2001 |
| 6,480,182 | B2 | 11/2002 | Turner et al. | FR | 2 693 005 | 12/1993 |
| 6,504,524 | B1 | 1/2003 | Gates et al. | GB | 1 314 906 | 4/1973 |
| 6,506,438 | B2 | 1/2003 | Duthaler et al. | GB | 1 465 701 | 3/1977 |
| 6,512,354 | B2 | 1/2003 | Jacobson et al. | GB | 2 044 508 A | 10/1980 |
| 6,515,649 | B1 | 2/2003 | Albert et al. | GB | 2 094 044 A | 9/1982 |
| 2002/0021270 | A1 | 2/2002 | Albert | GB | 2 255 934 A | 11/1992 |
| 2002/0090980 | A1 | 7/2002 | Wilcox et al. | GB | 2 292 119 A | 2/1996 |
| 2002/0130832 | A1 | 9/2002 | Baucom et al. | GB | 2 306 229 A | 4/1997 |
| 2002/0140688 | A1 | 10/2002 | Steinberg et al. | GB | 2 324 273 A | 10/1998 |
| 2002/0145792 | A1 | 10/2002 | Jacobson et al. | GB | 2 330 451 A | 4/1999 |
| 2002/0154382 | A1 | 10/2002 | Morrison et al. | JP | 53-73098 | 6/1978 |
| | | | | JP | 54-152497 | 11/1979 |
| | | FOREIGN PATENT DOCUMENTS | | JP | 55096922 | 7/1980 |
| EP | | 0 087 193 A2 | 2/1982 | JP | 59098227 | 6/1984 |
| EP | | 0 186 710 A1 | 6/1984 | JP | 60189731 | 9/1985 |
| EP | | 0 180 685 | 5/1986 | JP | 60197565 | 10/1985 |
| EP | | 0 268 877 A2 | 6/1988 | JP | 61074292 | 4/1986 |
| EP | | 0 268 877 A3 | 6/1988 | JP | 62269124 | 5/1986 |
| EP | | 0 281 204 A2 | 9/1988 | JP | 62058222 | 3/1987 |
| EP | | 0 323 656 B1 | 7/1989 | JP | 62200335 | 9/1987 |

| | | | | | |
|---|---|---|---|---|---|
| JP | 62200336 | 9/1987 | JP | 00137250 | 5/2000 |
| JP | 62231930 | 10/1987 | JP | 00140582 | 5/2000 |
| JP | 62299824 | 12/1987 | JP | 00162650 | 6/2000 |
| JP | 63-006632 | 1/1988 | JP | 00171839 | 6/2000 |
| JP | 64 86116 | 3/1989 | JP | 00194020 | 7/2000 |
| JP | 01086116 | 3/1989 | JP | 00194021 | 7/2000 |
| JP | 01086117 A | 3/1989 | JP | 00206574 | 7/2000 |
| JP | 01086118 A | 3/1989 | JP | 00221546 | 8/2000 |
| JP | 1-88986 | 4/1989 | JP | 00227612 | 8/2000 |
| JP | 1088986 | 4/1989 | JP | 00231307 | 8/2000 |
| JP | 01125613 | 5/1989 | JP | 00258805 | 9/2000 |
| JP | 1125613 A | 5/1989 | JP | 00259102 | 9/2000 |
| JP | 01142537 A | 6/1989 | JP | 00285219 | 10/2000 |
| JP | 01177517 | 7/1989 | JP | 2000-321605 | 11/2000 |
| JP | 01248182 A | 10/1989 | JP | 2000-322001 | 11/2000 |
| JP | 01267525 | 10/1989 | JP | 2000-322002 | 11/2000 |
| JP | 02223934 A | 9/1990 | JP | 2000-322003 | 11/2000 |
| JP | 02223935 A | 9/1990 | JP | 2000-322004 | 11/2000 |
| JP | 02223936 A | 9/1990 | JP | 2000-322005 | 11/2000 |
| JP | 02284124 A | 11/1990 | JP | 2000-322006 | 11/2000 |
| JP | 02284125 A | 11/1990 | JP | 2000-322007 | 11/2000 |
| JP | 03053114 A | 3/1991 | JP | 00315253 | 11/2000 |
| JP | 3053224 | 3/1991 | JP | 00321605 | 11/2000 |
| JP | 3091722 | 4/1991 | JP | 00322001 | 11/2000 |
| JP | 03091722 A | 4/1991 | JP | 00322002 | 11/2000 |
| JP | 3096925 | 4/1991 | JP | 00322003 | 11/2000 |
| JP | 03096925 A | 4/1991 | JP | 00322004 | 11/2000 |
| JP | 3118196 | 5/1991 | JP | 00322005 | 11/2000 |
| JP | 04 029291 | 1/1992 | JP | 00322006 | 11/2000 |
| JP | 04060518 | 2/1992 | JP | 00322007 | 11/2000 |
| JP | 4060518 A | 2/1992 | JP | 2000-352946 | 12/2000 |
| JP | 04086785 | 3/1992 | JP | 00352946 | 12/2000 |
| JP | 04199638 | 7/1992 | JP | 01005040 | 1/2001 |
| JP | 04212990 A | 8/1992 | JP | 01020093 | 1/2001 |
| JP | 4307523 | 10/1992 | JP | 01033831 | 2/2001 |
| JP | 04307523 A | 10/1992 | JP | 01045412 | 2/2001 |
| JP | 4-355786 | 12/1992 | JP | 01051490 | 2/2001 |
| JP | 04345133 A | 12/1992 | JP | 01056653 | 2/2001 |
| JP | 05035188 | 2/1993 | JP | 06239896 | 5/2001 |
| JP | 5-61421 | 3/1993 | WO | WO 82/02961 | 9/1982 |
| JP | 05165064 A | 6/1993 | WO | WO 90/08402 | 7/1990 |
| JP | 05173194 A | 7/1993 | WO | WO 92/09061 | 5/1992 |
| JP | 9-211499 | 8/1993 | WO | WO 92/12453 | 7/1992 |
| JP | 05307197 A | 11/1993 | WO | WO 92/17873 | 10/1992 |
| JP | 6089081 | 3/1994 | WO | WO 92/20060 | 11/1992 |
| JP | 9385609 | 3/1994 | WO | WO 92/21733 | 12/1992 |
| JP | 6-202168 | 7/1994 | WO | WO 93/02443 | 2/1993 |
| JP | 07036020 | 2/1995 | WO | WO 93/04458 | 3/1993 |
| JP | 08006508 | 1/1996 | WO | WO 93/04459 | 3/1993 |
| JP | 2551783 | 8/1996 | WO | WO 93/05425 | 3/1993 |
| JP | 08234176 | 9/1996 | WO | WO 93/07608 | 4/1993 |
| JP | 9-6277 | 1/1997 | WO | WO 93/17414 | 9/1993 |
| JP | 9006508 A | 1/1997 | WO | WO 93/18428 | 9/1993 |
| JP | 09016116 | 1/1997 | WO | WO 94/16427 | 7/1994 |
| JP | 9031453 A | 2/1997 | WO | WO 94/19789 | 9/1994 |
| JP | 9-185087 | 7/1997 | WO | WO 94/24236 | 10/1994 |
| JP | 09230391 | 9/1997 | WO | WO 94/28202 | 12/1994 |
| JP | 10-48673 | 2/1998 | WO | WO 95/02636 | 1/1995 |
| JP | 10142628 | 5/1998 | WO | WO 95/05622 | 2/1995 |
| JP | 10 149118 | 6/1998 | WO | WO 95/06307 | 3/1995 |
| JP | 10-161161 | 6/1998 | WO | WO 95/07527 | 3/1995 |
| JP | 10149118 A | 6/1998 | WO | WO 95/10107 | 4/1995 |
| JP | 11073004 | 3/1999 | WO | WO 95/15363 | 6/1995 |
| JP | 11073083 | 3/1999 | WO | WO 95/19227 | 7/1995 |
| JP | 11084953 | 3/1999 | WO | WO 95/22085 | 8/1995 |
| JP | 11143201 | 5/1999 | WO | WO 95/27924 | 10/1995 |
| JP | 11153929 | 6/1999 | WO | WO 95/33085 | 12/1995 |
| JP | 11161115 | 6/1999 | WO | WO 96/13469 | 5/1996 |
| JP | 11202804 | 7/1999 | WO | WO 97/04398 | 2/1997 |
| JP | 11212499 | 8/1999 | WO | WO 97/20274 | 6/1997 |
| JP | 11219135 | 8/1999 | WO | WO 97/24907 | 7/1997 |
| JP | 11237851 | 8/1999 | WO | WO 97/35298 | 9/1997 |
| JP | 11264812 | 9/1999 | WO | WO 97/49125 | 12/1997 |
| JP | 11352526 | 12/1999 | WO | WO 98/03896 | 1/1998 |
| JP | 00066247 | 3/2000 | WO | WO 98/19208 | 5/1998 |
| JP | 00066248 | 3/2000 | WO | WO 98/41898 | 9/1998 |
| JP | 00066249 | 3/2000 | WO | WO 98/41899 | 9/1998 |
| JP | 00089260 | 3/2000 | WO | WO 98/58383 | 12/1998 |
| JP | 00127478 | 5/2000 | WO | WO 99/03087 | 1/1999 |

| | | |
|---|---|---|
| WO | WO 99/03626 | 1/1999 |
| WO | WO 99/05236 | 2/1999 |
| WO | WO 99/05237 | 2/1999 |
| WO | WO 99/05238 | 2/1999 |
| WO | WO 99/05645 | 2/1999 |
| WO | WO 99/05646 | 2/1999 |
| WO | WO 99/10767 | 3/1999 |
| WO | WO 99/10768 | 3/1999 |
| WO | WO 99/10769 | 3/1999 |
| WO | WO 99/12170 | 3/1999 |
| WO | WO 99/14762 | 3/1999 |
| WO | WO 99/14763 | 3/1999 |
| WO | WO 99/20682 | 4/1999 |
| WO | WO 99/27414 | 6/1999 |
| WO | WO 99/41728 | 8/1999 |
| WO | WO 99/41732 | 8/1999 |
| WO | WO 99/41787 | 8/1999 |
| WO | WO 99/41788 | 8/1999 |
| WO | WO 99/47970 | 9/1999 |
| WO | WO 99/53371 | 10/1999 |
| WO | WO 99/53373 | 10/1999 |
| WO | WO 99/56171 | 11/1999 |
| WO | WO 99/59101 | 11/1999 |
| WO | WO 99/60554 | 11/1999 |
| WO | WO 99/65011 | 12/1999 |
| WO | WO 99/65012 | 12/1999 |
| WO | WO 99/67678 | 12/1999 |
| WO | WO 00/03291 | 1/2000 |
| WO | WO 00/03349 | 1/2000 |
| WO | WO 00/05704 | 2/2000 |
| WO | WO 00/08689 | 2/2000 |
| WO | WO 00/10048 | 2/2000 |
| WO | WO 01/11424 | 2/2000 |
| WO | WO 00/16189 | 3/2000 |
| WO | WO 00/20921 | 4/2000 |
| WO | WO 00/20922 | 4/2000 |
| WO | WO 00/20923 | 4/2000 |
| WO | WO 00/26761 | 5/2000 |
| WO | WO 00/36465 | 6/2000 |
| WO | WO 00/36560 | 6/2000 |
| WO | WO 00/36649 | 6/2000 |
| WO | WO 00/36666 | 6/2000 |
| WO | WO 00/49593 | 8/2000 |
| WO | WO 00/54101 | 9/2000 |
| WO | WO 00/75720 | 12/2000 |
| WO | WO 00/77570 | 12/2000 |
| WO | WO 00/77571 | 12/2000 |
| WO | WO 01/40856 A1 | 6/2001 |
| WO | WO 01/65309 A1 | 9/2001 |
| WO | WO 01/67170 A1 | 9/2001 |
| WO | WO 01/86346 A1 | 11/2001 |
| WO | WO 02/00747 A1 | 1/2002 |
| WO | WO 02/01281 A2 | 1/2002 |
| WO | WO 02/45061 A2 | 6/2002 |
| WO | WO 02/47363 A2 | 6/2002 |
| WO | WO 02/057843 A2 | 7/2002 |
| WO | WO 02/079869 A1 | 10/2002 |

OTHER PUBLICATIONS

Ackerman, J.; E Ink of Cambridge Gets Start-Up Funding; Dec. 24, 1997; D4; Boston Globe.
Amundson et al.; 12.3: Flexible. Active-Matrix Display Constructed Using a Microencapsulated Electrophoretic Material and an Organic-Semiconductor-Based Backplane; Jan. 1, 2001; 160-63; SID 01 Digest.
Bao et al.; High-Performance Plastic Transistors Fabricated by Printing Techniques; Jan. 1, 1997; 1299-01; Chem. Mater.; 9(6).
Beilin, et al.; 8.5: 2000-Character Electrophoretic Display; Jan. 1, 1986; 136-40; SID 86 Digest.
Berst, Jesse; E-Paper Here Sooner Than You Think; Nov. 20, 2000; http://www.zdnet.com/filters/printerfriendly/0.6061,2656348-10,00.html.
Blazo. S.F.; 10.1/9:00 A.M.: High Resolution Electrophoretic Display with Photoconductor Addressing; Jan. 1, 1982; 92-93; SID 82 Digest.
Bohnke et al.; Polymer-Based Solid Electrochromic Cell for Matrix-Addressable Display Devices; Dec. 1, 1991; 3612-17; Journal of the Electrochemical Society; 138(12).
Boston Herald; E Ink Debuts in J.C. Penney Stores; May 3, 1999; 27; Boston Herald.
Bruce, C.A; Dependence of Ink Jet Dynamics on Fluid Characteristics; May 1, 1976; 258-270; IBM J. Res. Develop.
Business Wire: E Ink and Lucent Technologies Demonstrate World's First Flexible Electronic Ink Display with Plastic Transistors; Nov. 20, 2000; http://www.zdnet.com/cgi-bin/printme.fcgi?t=zdil.
Butler, D.; Electronic Ink for Current Issues; May 3, 2001; 5; Nature; 411.
Cameron, David; Flexible Displays Gain Momentum; Jan. 22, 2002; An MIT Enterprise—Technology Review—Emerging Techonologies and Their Impact.
Chen et al.; 12.2: A Conformable Electronic Ink Display Using a Foil-Based a-Si TFT Array; Jan. 1, 2001; 157-59; SID 01 Digest.
Chen, Y; Flexible Active-Matrix Electronic Ink Display: May 8, 2003; 136; Nature; 423.
Chiang et al.; 7.5/4:05 P.M.: A Stylus Writable Electrophoretic Display Device; Jan. 1, 1979; 44-45; SID 79 Digest.
Chiang et al.; 11.5/4:10 P.M.: A High Speed Electrophoretic Matrix Display; Jan. 1, 1980; 114-115; SID 80 Digest.
Chiang, A.; Reduction of Lateral Migration in Matrix Addressed Electrophoretic Display; Jan. 1, 1980; 73-74; Xerox Disclosure Journal; 5(1).
Chiang, A.; Conduction Mechanism of Charge Control Agents Used in Electrophoretic Display Devices; Jul. 1, 1977; 275-282; Proceeding of the S.I.D.; 18( 3 & 4).
Comiskey et al.; An Electrophoretic Ink for All-Printed Reflective Electronic Displays; Jul. 16, 1998; 253-55; Nature; 394.
Comiskey et al.; 7.4L: Late-News Paper. Electrophoretic Ink: A Printable Display Material; Jan. 1, 1997; 75-76; SID 97 Digest.
Crawford, G.; A Bright New Page In Portable Displays; Oct. 1, 2000; pp. 40-46; IEEE Spectrum; N/A.
Croucher et al.; Electrophoretic Display: Materials as Related to Performance; Mar. 1, 1981; 80-86; Photographic Science and Engineering; 25(2).
Dalisa, A. L.; Electrophoretic Display Technology; Jul. 1, 1977; 827-34; IEEE Transactions on Electron Devices; 24(7).
Dalisa, A.L.; Electrophoretic Displays; Jan. 1, 1980; 215-232; Display Devices.
Dobson, R.; Electronic Book is a Whole Library; Feb. 25, 1996; Sunday Times, Book Review.
Drzaic et al; A Printed and Rollable Bistable Electronic Display; Jan. 1, 1998; 1131-34; 1998 SID International Symposium. Digest of Technical Papers; 29.
Duthhaler et al.; Active-Matrix Color Displays Using Electrophoretic Ink and Color Filters; Jan. 1, 2002; 1374-1377; SID 02 Digest.
Edwards. J.; Easy Writer. Digital Paper Promises to Revolutionize Publishing; Aug. 1, 2001; 86, 89, 90 & 92; Emerging Technology—CIO.
Egashira et al.; A Solid Electrochromic Cell Consisting of Lu-Diphthaocyanine and Lead Fluoride; Jan. 1, 1987; 227-32; Proceeding of the SID; 28(3).
Esen et al.; Synthesis of Spherical Microcapsules by Photopolymerization in Aerosols; Jan. 1, 1997; 131-137; Colloid & Polymer Science; 275(2).
Fitzhenry, B.; Identification of a Charging Mechanism using Infrared Spectroscopy; Jan. 1, 1979; 107-110; Applied Spectroscopy; 33(2).
Fitzhenry-Ritz, B.; Optical Effects of Adsorption of dyes on Pigment Used in Electrophoretic Image Displays; Oct. 1, 1979; 3332-37; Applied Optics; 18(19).
Fitzhenry-Ritz, B.; Optical Properties of Electrophorectic Image Displays; Jan. 1, 1981; 300-09; Proceedings of the SID; 22(4).
Flaherty, J; What Did Disappearing Ink Grow Up to Be? Electronic Ink; May 6, 1999; E3; The New York Times.
Franjione et al.; The Art and Science of Microencapsulation; Jun. 1, 1995; Technology Today.
French, M; E Ink Pens Deal with Phoenix Paper, Safeway; Sep. 18, 2000; 9; Mass. High Tech.
Goodman, L.A.; Passive Liquid Displays: Liquid Crystals, Electrophoretics, and Electrochromics; Jan. 1, 1976; 30-38; Proceeding of the S.I.D.; 17(1).
Gutcho; Additional Uses for Encapsulated Products; Jan. 1, 1976; 279-343; Microcapsules and Microencapsulation Techniques.

Harbour et al.; Subdivided Electrophoretic Display; Jan. 1, 1979; 705; Xerox Disclosure Journal; 4(6).

Hatano et al.; 18.3: Bistable Paper-White Display Device Using Cholesteric Liquid Crystals; Jan. 1, 1996; 269-72; SID 96 Digest.

Heinzl et al.; Ink Jet Printing; Jan. 1, 1985; 91-171; Advances in Electronics and Electron Physics; 65.

Hopper,et al.; An Electrophoretic Display, Its Properties, Model, and Addressing; Aug. 1, 1979; 1148-52; IEEE Transactions on Electron Devices; Ed-26, No. 8.

Hosaka et al.; Electromagnetic Microrelays: Concepts and Fundamental Characteristics; Jan. 1, 1994; 41-47; Sensors and Actuators A.; A40(1).

Hou et al.; 12.4: Active Matrix Electrophoretic Displays Containing Black and White Particles with Opposite Polarities; Jan. 1, 2001; 164-67; SID 01 Digest.

Howe, P. J.; MIT Book Would Bind Computer 'Ink' to Paper; Mar. 17, 1996; 31, 35; Boston Globe.

Jackson et al; Organic Thin-Film Transistors for Organic Light-Emitting Flat-Panel Display Backplanes; Jan. 1, 1998; IEEE Journal of Selected Topics in Quantum Electronics; 4(1).

Jacobson et al.; The Last Book; Jan. 1, 1997; 457-463; IBM Systems Journa; 36(3).

Ji et al.; P-50: Polymer Walls in Higher-Polymer-Content Bistable Reflective Cholesteric Displays; Jan. 1, 1996; 611-13; SID 96 Digest.

Jo et al.; Toner Display Based on Particle Movements; Jan. 1, 2002; 664-669; Chem. Mater.; 14(2).

Kazlas et al.; 12.1: 12.1 SVGA Microencapsulated Electrophoretic Active Matrix Display for Information Appliances; Jan. 1, 2001; 152-55; SID 01 Digest.

Kenward, M.; Displaying a Winning Glow; Jan. 1, 1999; 69-73; Technology Review.

Klien, A.; Will the Future Be Written in E-Ink?; Jan. 4, 2000; Wall Street Journal.

Kornfeld, C.; 9.5: A Defect-Tolerant Active Matrix Electrophoretic Display; Jan. 1, 1984; 142-44; SID 84 Digest.

Lee, L. L.; A Magnetic-Particles Display; Jul. 1, 1975; 177-184; Proceeding of the S.I.D.; 16(3).

Lee, L. L.; Fabrication of Magnetic Particles Display; Jul. 1, 1977; 283-88; Proceeding of the S.I.D.; 18(3, 4).

Lewis J.C.; Electrophoretic Displays; 223-240; Nonemissive Electrooptic Displays (Plenum Press).

Lewis, et al.; Gravitational, Inter-Particle and Particle-Electrode Forces in the Electrophoretic Display; Jul. 1, 1977; 235-42; Proceeding of the SID.; 18(3, 4).

Matsumoto et al.; Generation of Monodispered Concentric Two Phase Droplets for Encapsulation; Jun. 20, 1982; 63-67; ICLASS—'82, Reports & Proc. 2nd Int. Conf. On Liquid Atomization & Spray Systems.

Matsumoto et al.; A Production Process for Uniform-Size Polymer Particles; Jan. 1, 1989; 691-693; Journal of Chemical Engineering of Japan; 22(6).

Matsumoto et al.; Production of Monodispersed Capsules; Jan. 1, 1986; 25-31; J. Microencapsulation; 3(1).

Minnema et al.; Pattern Generationin Polyimide Coatings and Its Application in an Electrophoretic Image Display; Jun. 1, 1988; 815-22; Polymer Engineering and Science; 28(12).

Moesner et al.; Devices for Particle Handling by an AC Electric Field; Jan. 1, 1995; 66-71; 1995 IEEE.

Mürau et al.; The Understanding and Elimination of Some Suspension Instabilities in an Electrophoretic Display; Sep. 1, 1978; 4820-29; Journal of Applied Physics; 49(9).

Mürau et al.; 7.6/4:40 P.M.: An Electrophoretic Radiographic Device; Jan. 1, 1979; 46-47; SID 79 Digest.

Murau, P.; 9.4: Characteristics of an X-Y Addressed Electrophorectic Image Display (EPID); Jan. 1, 1984; 141; SID 84 Digest.

Nakamura et al.; 37.3: Development of Electrophoretic Display Using Microencapsulated Suspension,; May 1, 1998; 1014-17; 1998 ISD International Symposium Disgust of Technical Papers, Proceedings of SID '98 International Symposium. Anaheim, CA, USA; 29.

!Digital Ink Meets Eleatronic Paper; Dec. 9, 2001; The Economist.

Negroponte et al.; Surfaces and Displays; Jan. 1, 1997; 212; Wired.

Ota et al.; Electrophoretic Image Display (EPID) Panel, Proceedings of the IEEE; Jan. 1, 1973; 1-5.

Ota el al.; Developments in Electrophoretic Displays; Jul. 1, 1977; 243-54; Proceedings of the S.I.D.; 18(3, 4).

Ota et al.; Electrophoretic Display Devices; Jan. 1, 1975; 145-48; Laser 75 Optoelectronic Conference Proceedings.

Pankove. J. I.; Color Reflection Type Display Panel; Mar. 1, 1962; 2 sheets; RCA Technical Notes; 535.

Pearistein, F.; Electroless Plating; 710-47; Modem Electroplating.

Peterson, I.; Rethinking Ink: Printing the Pages of an Electronic Book; Jun. 20, 1998; 396-397; Science News; 153.

Pitt, M.G. ; 53.2: Power Consumption of Micro-encapsulated Electrophoretic Displays for Smart Handheld Applications; Jan. 1, 2002; 1378-1381; SID 02 Digest.

Platt, C.; Digital Ink; May 1, 1997; 162-165, 208-209, 211; Wired.

Quon, W. S.; Multilevel Voltage Select (MLVS): A Novel Technique to X-Y Address an Electrophoretic Image Display; Aug. 1, 1977; 1121-23; IEEE Transactions on Electron Devices; 24(8).

Reuters; New Electronic Paper Displays Video Too; Sep. 24, 2003; cnn.com/technology.

Ridley et al.; All-Inorganic Field Effect Transistors Fabricated by Printing; Oct. 22, 1999; 746-48; Science: 286.

Robert A. Hayes and B. J. Feenstra; Video-speed electronic paper based on electrowetting; Sep. 25, 2003; 383-85; Nature; vol. 425.

Saitoh et al.; A Newly Developed Electrical Twisting Ball Display; Jan. 1, 1982; 249-53; Proceedings of the SID; 23(4).

Sankus, J.; Electrophoretic Display Cell; May 1, 1979; 309; Xerox Disclosure Journal; 4(3).

Sheridon et al.; 10.2/9:25 A.M.: A Photoconductor-Addressed Electrophoretic Cell for Office Data Display; Jan. 1, 1982; 94-95; SID 82 Digest.

Sheridon et al.; The Gyricon—A Twisting Ball Display; Jul. 1, 1977; 289-93; Proceeding of the S.I.D.; 18(3, 4).

Shiffman et al.; An Electrophoretic Image Display with Internal NMOS Address Logic and Display Drivers; Jan. 1, 1984; 105-15; Proceedings of the SID; 25(2).

Shimoda et al.; 26.3: Multicolor Pixel Patterning of Light-Emitting Polymers by Ink-Jet Printing; May 18, 1999; 376-79; Society for Information Display International Symposium Digest of Technical Papers; 30.

Shiwa et al.; 5.6: Electrophoretic Display Method Using Ionographic Technology; Jan. 1, 1988; 61-62; SID 88 Digest.

Singer et al.; An X-Y Addressable Electrophoretic Display; Jul. 1, 1977; 255-66; Proceeding of the S.I.D.

Sirringhaus, H et al; Integrated Optoelectronic Devices Based on Conjugated Polymers; Jun. 12, 1998; 1741-1744; Science; 280.

Soule, CA; E Ink Pens Deal with Lucent; Jul. 10, 2000; 1, 18; Mass. High Technology.

Thomasson, D. et al; High Mobility Tri-Layer a-Si:H Thin-Film Transistors with Ultrathin Active Layer, Aug. 17, 1997; 397-399; IEEE Electron Device Letters; vol. 18, No. 8.

Torsi et al.; Organic Thin-Film-Transistors with High on/off Ratios; Jan. 1, 1995; 695-700; Materials Research Society Symp. Proc.; 377.

Toyama et al.; P-43: An Electrophoretic Matrix Display with External Logic and Driver Directly Assembled to the Panel; Jan. 1, 1994; 588-90; SID 1994 Digest.

Vance, D.W.; Optical Characteristics of Electrophoretic Displays; Jul. 1, 1997; 267-74; Proceeding of the S.I.D.; 18(3, 4).

Vandegaer, J.E.; Microencapsulation: Processes and Applications; Aug. 28, 1973; 1-180; Proceedings of the American Chemical Society Symposium on Microencapsulation, Chicago, IL (published by Plenum Press, New York, 1974).

Vaz et al.; Dual Frequency Addressing of Polymer-Dispensed Liquid-Crystal Films; Jun. 15, 1989; 5043-49; Journal of Applied Physics; 65(12).

Webber, R. M.; 10.4: Image Stability in Active-Matrix Microencapsulated Electrophoretic Displays; Jan. 1, 2002; 126-129; SID 02 Digest.

White, R; An Electrophoretic Bar Graph Display; Jan. 1, 1981; 173-80; Proceedings of the SID; 22/3.

Wilmsen, S.; Electronic Ink' Sign Debuts at JC Penney; May 4, 1999; C9; Boston Globe.

Wisnieff, R.; Printing Screens; Jul. 16, 1998; 225, 227; Nature; 394.

Witkowski, T. ; E Ink Expected to open First E-Book with $25M Investment; Mar. 1, 2002; Boston Business Journal.

Yamaguchi et al.; Equivalent Circuit of Ion Projection-Driven Electrophoretic Display; Dec. 1, 1991; 4152-56; IEICE Transaction; 74(12).

Yamaguchi, Yoshiro; Toner Display Using Insulative Particles Charged Triboelectrically; Oct. 22, 2001; 1729-30; Asia Display/IDW '01; AMD4-4 (Late-News Paper).

Yang et at.; A New Architecture for Polymer Transistors; Nov. 24, 1994; 344-46; Nature; 372.

Yang, K.H.; The Investigation of Image Formation in a Large-Area Solid State X-Ray Receptor with Electrophoretic Display; Sep. 1, 1983; 4711-21; Journal of Applied Physics; 54(9).

Ziemelis, K.; Putting it on Plastic; Jun. 18, 1998; 619-20; Nature; 393.

Kimlin, Administrative Patent Judge; Full Color Reflective Display with Multichromatic Sub-Pixels; Mar. 24, 2004; 1-9; Decision on Appeal No. 2004-0103.

Poteate, Administrative Patent Judge: Full Color Reflective Display with Multichromatic Sub-Pixels; Sep. 26, 2003; 1-7; Decison on Appeal No. 2003-1345.

Waltz, Administrative Patent Judge; Color Eledrophoretic Displays; Jun. 17, 2004; 1-12; Decision on Appeal No. 2003-0784.

FULL COLOR REFLECTIVE DISPLAY WITH MULTICHROMATIC SUB-PIXELS

CROSS-REFERENCE TO RELATED APPLICATIONS

This application is a continuation of prior application Ser. No. 09/289,507 filed Apr. 9, 1999 (now U.S. Pat. No. 7,075, 502), which in turn claims priority to U.S. Ser. No. 60/081, 362 filed Apr. 10, 1998. The entire disclosures of both these prior applications are incorporated by reference herein.

FIELD OF THE INVENTION

The present invention relates to electronic displays and, in particular, to full color electrophoretic displays and methods of creating full-color microencapsulated eletrophoretic displays.

BACKGROUND OF THE INVENTION

There are a number of enhanced reflective display media which offer numerous benefits such as enhanced optical appearance, the ability to be constructed in large form factors, capable of being formed using flexible substrates, characterized by easy manufacturability and manufactured at low cost. Such reflective display media include microencapsulated electrophoretic displays, rotating ball displays, suspended particle displays, and composites of liquid crystals with polymers (known by many names including but not limited to polymer dispersed liquid crystals, polymer stabilized liquid crystals, and liquid crystal gels). Electrophoretic display media, generally characterized by the movement of particles through an applied electric field, are highly reflective, can be made bistable, and consume very little power. Further, encapsulated electrophoretic displays also may be printed. These properties allow encapsulated electrophoretic display media to be used in many applications for which traditional electronic displays are not suitable, such as flexible, printed displays.

While bichromatic electrophoretic displays have been demonstrated in a limited range of colors (e.g. black/white or yellow/red), to date there has not been successful commercialization of a full-color electrophoretic display. Indeed, no reflective display technology to date has shown itself capable of satisfactory color. Full-color reflective displays typically are deficient when compared to emissive displays in at least two important areas: brightness and color saturation.

One traditional technique for achieving a bright, full-color display which is known in the art of emissive displays is to create sub-pixels that are red, green and blue. In this system, each pixel has two states: on, or the emission of color; and off. Since light blends from these sub-pixels, the overall pixel can take on a variety of colors and color combinations. In an emissive display, the visual result is the summation of the wavelengths emitted by the sub-pixels at selected intensities, white is seen when red, green and blue are all active in balanced proportion or full intensity. The brightness of the white image is controlled by the intensities of emission of light by the sub-pixels. Black is seen when none are active or, equivalently, when all are emitting at zero intensity. As an additional example, a red visual display appears when the red sub-pixel is active while the green and blue are inactive, and thus only red light is emitted.

It is known that this method can be applied to bichromatic reflective displays, typically using the cyan-magenta-yellow subtractive color system. In this system, the reflective sub-pixels absorb characteristic portions of the optical spectrum, rather than generating characteristic portions of the spectrum as do the pixels in an emissive display. White reflects everything, or equivalently absorbs nothing. A colored reflective material reflects light corresponding in wavelength to the color seen, and absorbs the remainder of the wavelengths in the visible spectrum. To achieve a black display, all three sub-pixels are turned on, and they absorb complementary portions of the spectrum.

However, the colors displayed by a full-color display as described above are sub-optimal. For example, to display red, one pixel displays magenta, one displays yellow, and one displays white. The white sub-pixel reduces the saturation of red in the image and reduces display contrast. The overall effect is a washed out red. This further illustrates why no method to date has been capable of generating a high-contrast, high-brightness full color reflective display with good color saturation.

SUMMARY OF THE INVENTION

This invention teaches practical ways to achieve brighter, more saturated, reflective full-color displays than previously known, particularly full-color encapsulated, electrophoretic displays.

An object of the invention is to provide a brighter, more satured, reflective full-color display. In some embodiments, the displays are highly flexible, can be manufactured easily, consume little power, and can, therefore, be incorporated into a variety of applications. The invention features a printable display comprising an encapsulated electrophoretic display medium. In an embodiment the display media can be printed and, therefore the display itself can be made inexpensively.

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the terms bistable and multistable, or generally, stable, will be used to indicate a display in which any optical state remains fixed once the addressing voltage is removed. The definition of a stable state depends on the application for the display. A slowly-decaying optical state can be effectively stable if the optical state is substantially unchanged over the required viewing time. For example, in a display which is updated every few minutes, a display image which is stable for hours or days is effectively bistable or multistable, as the case may be, for that application. In this invention, the terms bistable and multistable also indicate a display with an optical state sufficiently long-lived as to be effectively stable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable or multistable. Whether or not an encapsulated electrophoretic display is stable, and its degree of stability, can be controlled through appropriate chemical modification of the electrophoretic particles, the suspending fluid, the capsule, and binder materials.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder. Various materials and combinations of materials useful in constructing encapsulated electrophoretic displays are described in co-pending application Ser. No. 09/140,861, the contents of which are incorporated by reference herein.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. A "printed element" refers to an element formed using any one of the above techniques.

As noted above, electrophoretic display elements can be encapsulated. Throughout the Specification, reference will be made to "capsules," "pixels," and "sub-pixels." A pixel display element can be formed by one or more capsules or sub-pixels. A sub-pixel may itself comprise one or more capsules or other structures.

A full color, reflective display having superior saturation and brightness is achieved with a novel display element comprising multichromatic sub-elements. One embodiment of the display employs three sub-pixels, each sub-pixel comprising a capsule including three species of particles which differ visually. Another embodiment of the display employs color filters combined with an encapsulated electrophoretic display to provide different visual states. In still another embodiment, the display employs display elements capable of more than three visual states. In yet another embodiment, the visual display states are selected from specific colors, for example, the primary colors red, green and blue, or their complements, and white and/or black. The display element presents a visual display in response to the application of an electrical signal to at least one of the capsules.

In one aspect, the present invention relates to an electrophoretic display element. The display element comprises a first capsule including a first species of particles having a first optical property and a second species of particles having a second optical property visually different from the first optical property. The display element further comprises a second capsule including a third species of particles having a third optical property and a fourth species of particles having a fourth optical property visually different from the third optical property. The display element presents a visual display in response to the application of an electrical signal to at least one of the first and second capsules. The first optical property and the third optical property can be, but are not required to be, substantially similar in appearance.

The electrophoretic display element can further comprise a fifth species of particles having a fifth optical property visually different from the first and second optical properties in the first capsule. It can also comprise a sixth species of particles having a sixth optical property visually different from the third and fourth optical properties in the second capsule. It can also include a third capsule having a seventh species of particles having a seventh optical property, an eighth species of particles having a eighth optical property, and a ninth species of particles having a ninth optical property.

The electrophoretic display element can include particles such that the first, third and seventh optical properties have a white visual appearance. The electrophoretic display element can include particles such that the second, fourth and eighth optical properties have a black visual appearance. The electrophoretic display element can have at least one of the optical properties be red, green, blue, yellow, cyan, or magenta in visual appearance. The electrophoretic display element can have at least one of the optical properties comprising color, brightness, or reflectivity.

The electrophoretic display element can have capsules which include a suspending fluid. The suspending fluid can be substantially clear, or it can be dyed or otherwise colored.

In another aspect, the present invention relates to a display apparatus comprising at least one display element which includes at least two capsules such as are described above and at least one electrode adjacent to the display element, wherein the apparatus presents a visual display in response to the application of an electrical signal via the electrode to the display element.

The display apparatus can include a plurality of electrodes adjacent the display element. The plurality of electrodes can include at least one which has a size different from others of the plurality of electrodes, and can include at least one which has a color different from others of the plurality of electrodes.

In another aspect, the present invention relates to an electrophoretic display element comprising a capsule containing a first species of particles having a first optical property, a second species of particles having a second optical property visually different from the first optical property, a third species of particles having a third optical property visually different from the first and second optical properties and a fourth species of particles having a fourth optical property visually different from the first, second, and third optical properties such that the element presents a visual display in response to the application of an electrical signal to the capsule. The electrophoretic display element can also include a suspending fluid within the capsule.

In yet another aspect, the present invention relates to an electrophoretic display element comprising a capsule containing a first species of particles having a first optical property, a second species of particles having a second optical property visually different from the first optical property, a third species of particles having a third optical property visually different from the first and second optical properties, a fourth species of particles having a fourth optical property visually different from the first, second, and third optical properties, and a fifth species of particles having a fifth optical property visually different from the first, second, third, and fourth optical properties such that the element presents a visual display in response to the application of an electrical signal to said capsule. The electrophoretic display element can also include a suspending fluid within the capsule.

In still another aspect, the present invention relates to a method of manufacturing an electrophoretic display. The manufacturing method comprises the steps of providing a first capsule containing a first species of particles having a first optical property and a second species of particles having a second optical property visually different from the first optical property, and providing a second capsule containing a third species of particles having a third optical property and a fourth species of particles having a fourth optical property visually different from the third optical property, such that when an electrical signal is applied to at least one of the first and second capsules the element presents a visual display in response to the signal. In this method of manufacture, the first optical property and the third optical property can be substantially similar in appearance.

In still a further aspect, the present invention relates to a method of manufacturing an electrophoretic display. This manufacturing method comprises the steps of providing a first capsule containing a first species of particles having a first optical property, a second species of particles having a second optical property visually different from the first optical property and containing a third species of particles having a third optical property visually different from the first and second optical properties, providing a second capsule containing a fourth species of particles having a fourth optical property, a fifth species of particles having a fifth optical property visually different from the fourth optical property and a sixth species of particles having a sixth optical property visually different from the fourth and fifth optical properties, and providing a third capsule containing a seventh species of particles having a seventh optical property, an eighth species of particles having a eighth optical property visually different from the seventh optical property, and a ninth species of particles having a ninth optical property visually different from the seventh and eighth optical properties, such that when an electrical signal is applied to at least one of the first, second and third capsules, the element presents a visual display in response to the signal.

The manufacturing method can include the step of providing a first capsule wherein the third optical property is red visual appearance, or is yellow visual appearance. The manufacturing method can include the step of providing a second capsule wherein the sixth optical property is green visual appearance, or is cyan visual appearance. The manufacturing method can include the step of providing a third capsule wherein the ninth optical property is blue visual appearance, or is magenta visual appearance. The manufacturing method can include the step of providing capsules wherein the first, fourth and seventh optical properties are white visual appearance, or wherein the second, fifth and eighth optical properties are black visual appearance.

BRIEF DESCRIPTION OF THE DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

DETAILED DESCRIPTION OF THE INVENTION

Figures 1A, 1B:
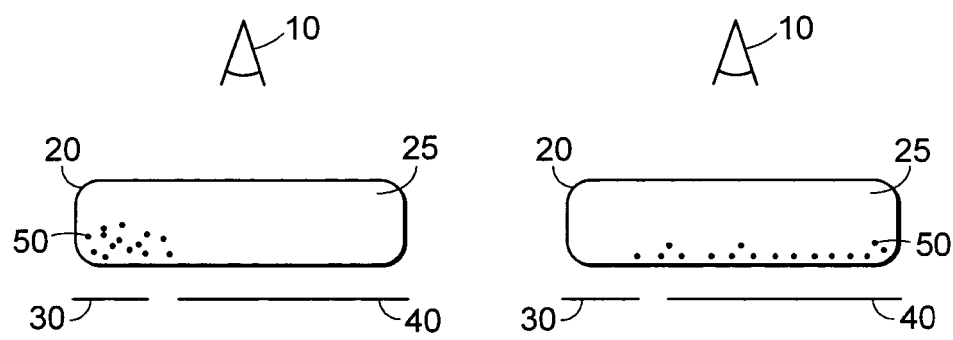
FIG. 1A is a diagrammatic side view of an embodiment of a rear-addressing electrode structure for a particle-based display in which a smaller electrode has been placed at a voltage relative to the large electrode causing the particles to migrate to the smaller electrode.
FIG. 1B is a diagrammatic side view of an embodiment of a rear-addressing electrode structure for a particle-based display in which the larger electrode has been placed at a voltage relative to the smaller electrode causing the particles to migrate to the larger electrode.

An electronic ink is an optoelectronically active material that comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate.

In one embodiment, the ink may comprise sub-pixels capable of displaying different colors. Sub-pixels may be grouped to form pixels. In one particular embodiment, each sub-pixel contains red particles, green particles, and blue particles, respectively. In another particular embodiment, each sub-pixel contains cyan particles, yellow particles, and magenta particles, respectively. In each example, each sub-pixel can additionally include particles which are white and particles which are black. By addressing each sub-pixel to display some fraction of its colored particles, and some portion of the white and black particles, a pixel can be caused to give an appearance corresponding to a selected color at a selected brightness level.

An electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there are a class of materials called electroconductive powders which are also useful as coatable transparent conductors in electronic ink displays. One example is Zelec ECP electroconductive powders from DuPont Chemical Co. of Wilmington, Del.

It is possible to produce any selected color from the superposition of suitable proportions of three properly chosen colors. In one embodiment, the colors red, green, and blue can be combined in various proportions to produce an image which is perceived as a selected color. Emissive or transmissive displays operate according to additive rules, where the perceived color is created by summing the emission wavelengths of a plurality of emitting or transmitting objects. For an emissive or transmissive display which includes three sub-pixels, one of which can produce red light, one green light, and one blue light, respectively, one can generate all colors, as well as white and black. At one extreme, the combination of all three at full intensity is perceived as white, and at the other, the combination of all three at zero intensity is perceived as black. Specific combinations of controlled proportions of these three colors can be used to represent other colors.

In a reflective display, the light which a viewer perceives is the portion of the spectrum which is not absorbed when the light to be reflected falls on the reflector surface. One may thus consider a reflecting system as a subtractive system, that is, that each reflective surface "subtracts" from the light that portion which the reflector absorbs. The color of a reflector represents the wavelengths of light the reflector absorbs. A yellow reflector absorbs substantially blue light. A magenta reflector absorbs substantially green light. A cyan reflector absorbs substantially red light. Thus, in an alternative embodiment employing reflectors, nearly the same results as an emissive system can be obtained by use of the three colors cyan, yellow, and magenta as the primary colors, from which all other colors, including black but not white, can be derived. To obtain white from such a display, one must further introduce a third state per sub-pixel, namely white.

One approach which may be taken to overcome the shortcomings inherent in two state displays is to create a display comprising individual pixels or pixels comprising sub-pixels that can support multiple color states. The use of multiple color states permits more robust color rendition and provides better contrast than is possible with two color states per pixel or per sub-pixel. For example, using a microencapsulated electrophoretic display, a single microcapsule with five kinds of particles could display white, cyan, magenta, yellow, or black all with excellent saturation. By foregoing black and using cyan/magenta/yellow to combine to black, a similar effect can be achieved with a display element capable of four color states.

The invention can also utilize any reflective display element that can create three color states within a single sub-pixel, where sub-pixels are combined to generate a variety of overall pixel colors. Such a display is capable of greatly improved appearance yet relies on only three color states per sub-pixel instead of four or five or more. A sub-pixel having only three color states can have advantages with regard to the operation of the display. Fewer and simpler applied voltage signals are needed to operate each sub-pixel of the display element, A sub-pixel having fewer stable states may be capable of being addressed more quickly than one with more stable states.

Various methods are possible by which three color states could be achieved within a single addressable region, which can be a display element sub-pixel. For example, a microencapsulated electrophoretic display element sub-pixel may contain particles in a clear suspension medium. A simple addressing method is to provide white particles having a positive charge, cyan particles having a negative charge, and red particles having no charge. In this example, white is achieved when the top electrode is negative and the bottom electrodes are both positive. Cyan is achieved when the top electrode is positive and the bottom electrodes are both negative. Red is achieved when the top electrode is set to ground, one bottom electrode is positive and attracts the cyan particles, and the other bottom electrode is negative and attracts the white particles, so that the red particles are uppermost and are seen.

Another example combines top and bottom motion with a sideways or so-called in-plane switching, control grid or shutter-effect method. In one example, red particles have strong positive charge, black particles have lesser positive charge, and the sub-pixel of the display incorporates a white sheet behind a clear bottom electrode. The clear bottom electrode comprises a larger sub-electrode and a smaller sub-electrode. In this example, using a shutter effect, red is achieved when the top electrode has a negative voltage and the bottom electrode, including both subelectrodes, has a positive voltage. Black is achieved when the top electrode has a positive voltage and the bottom electrode, including both subelectrodes, has a negative voltage. White is achieved when the smaller subelectrode of the bottom electrode is switched to a negative voltage but the top electrode and the larger subelectrode of the bottom electrode is switched to a less negative voltage. Thus the red and black particles are attracted to cluster at the smaller sub-electrode, with the slower black particles clustering on top and blocking from sight the red particles, and the bulk of the microcapsule is clear, allowing the white sheet to be visible. The top electrode may be masked so that the clustered particles are not visible. Additionally, the backing sheet could be replaced with a backlight or color filter and backlight. In another embodiment, a brief alternating voltage signal may be used prior to addressing methods described above to mix the particles into a random order.

While the methods described discuss particles, any combination of dyes, liquids droplets and transparent regions that respond to electrophoretic effects could also be used. Particles of various optical effects may be combined in any suitable proportion. For example, certain colors may be over- or under-populated in the electrophoretic suspension to account for the sensitivities of the human eye and to thereby achieve a more pleasing or uniform effect. Similarly, the sizes of the sub-pixels may also be disproportionate to achieve various optical effects.

Although these examples describe microencapsulated electrophoretic displays, the invention can be utilized across other reflective displays including liquid crystal, polymer-dispersed liquid crystal, rotating ball, suspended particle and any other reflective display capable of imaging three colors. For example, a bichromal rotating ball (or pyramid, cube, etc.) could be split into regions of multiple colors. One way to address such a display element would be to provide differing charge characteristics (such as charged vertices in the case of the pyramid) and to use various combinations and sequences of electrode voltage potentials across the surrounding top, bottom, or side electrodes to rotate the shape in a desired manner. In short, many addressing schemes are possible by which a sub-pixel in a direct color reflective display could be switched among three colors. Such switching mechanism will vary by the nature of the display and any suitable means may be used.

One embodiment of the invention is to separate each pixel into three sub-pixels, each sub-pixel being capable of displaying three color states, and to choose as the color state combinations a first sub-pixel being capable of displaying white, cyan or red, a second sub-pixel being capable of displaying white, magenta or green, and a third sub-pixel being capable of displaying white, yellow or blue. As has already been explained, for a reflective display, black can be displayed with the three sub-pixels turned to red, green and blue, respectively. This display achieves a more saturated black than is achieved under the two-state system. Alternatively, red is displayed with the sub-pixels turned to red, magenta and yellow, respectively, which offers a more saturated red than is obtained with a two-state system. Other colors may be obtained by suitable choices of the individual states of the sub-pixels.

Another embodiment of the invention is to separate each pixel into three sub-pixels, each sub-pixel being capable of displaying three color states, and to choose as the color state combinations a first sub-pixel being capable of displaying white, cyan or black, a second sub-pixel being capable of displaying white, magenta or black, and a third sub-pixel being capable of displaying white, yellow or black. In this embodiment, black and white are displayed directly with high saturation. For example, to display red, the first (cyan) sub-pixel is set to either white or black to achieve a dimmer or brighter color, respectively, the second sub-pixel is set to magenta, and the last sub-pixel is set to yellow.

Another embodiment of the invention is to separate each pixel into three sub-pixels, each sub-pixel being capable of displaying three color states, and to choose as the color state combinations a first sub-pixel being capable of displaying white, red or black, a second sub-pixel being capable of displaying white, green or black, and a third sub-pixel being capable of displaying white, blue or black. In this embodiment, black and white are displayed directly with high saturation. For example, to display red, the first sub-pixel is set to red, and the second and the third sub-pixels are set to either white or black to achieve a dimmer or brighter color, respectively.

While the embodiments above describe a pixel of three sub-pixels, each sub-pixel having three possible color states, the invention is embodied by any pixel containing two or more sub-pixels, where at least one sub-pixel can achieve three or more colors. In this manner a better effect can be achieved for reflective displays than can be achieved by adopting the simple two-state sub-pixel color change technique that is common to emissive displays.

Additionally, the invention can be extended to four or more color states to permit full color displays without the need for sub-pixels, and illustrates addressing mechanisms that work for three states and which can be extended or combined to achieve a display with four or more states.

Another means of generating color in a microencapsulated display medium is the use of color filters in conjunction with a contrast-generating optical element. One manifestation of this technique is to use a pixel element which switches between white and black. This, in conjunction with the color filter, allows for switching between a light and dark colored state to occur. However, it is known to those skilled in the art that different numbers of color filters (ranging from one to three) can be used in a sub-pixel, depending on how many colors are desired. Also, the microencapsulated particle display can switch between colors other than white and black. In this case, it is advantageous to use a color filter which is opposed (in a color sense) to the color of the pixel. For example, a yellow color filter used with a blue or white electrophoretic display would result in a green or yellow color to that element.

Additionally, there is an electrophoretic device known as a "shutter mode" display, in which particles are switched electrically between a widely-dispersed state on one electrode and a narrow band on the other electrode. Such a device can act as a transmissive light valve or reflective display. Color filters can be used with such a device.

Referring now to FIGS. 1A and 1B, an addressing scheme for controlling particle-based displays is shown in which electrodes are disposed on only one side of a display, allowing the display to be rear-addressed. Utilizing only one side of the display for electrodes simplifies fabrication of displays. For example, if the electrodes are disposed on only the rear side of a display, both of the electrodes can be fabricated using opaque materials, which may be colored, because the electrodes do not need to be transparent.

FIG. 1A depicts a single capsule 20 of an encapsulated display media. In brief overview, the embodiment depicted in FIG. 1A includes a capsule 20 containing at least one particle 50 dispersed in a suspending fluid 25. The capsule 20 is addressed by a first electrode 30 and a second electrode 40. The first electrode 30 is smaller than the second electrode 40. The first electrode 30 and the second electrode 40 may be set to voltage potentials which affect the position of the particles 50 in the capsule 20.

The particles 50 represent 0.1% to 20% of the volume enclosed by the capsule 20. In some embodiments the particles 50 represent 2.5% to 17.5% of the volume enclosed by capsule 20. In preferred embodiments, the particles 50 represent 5% to 15% of the volume enclosed by the capsule 20. In more preferred embodiments the particles 50 represent 9% to 11% of the volume defined by the capsule 20. In general, the volume percentage of the capsule 20 that the particles 50 represent should be selected so that the particles 50 expose most of the second, larger electrode 40 when positioned over the first, smaller electrode 30. As described in detail below, the particles 50 may be colored any one of a number of colors. The particles 50 may be either positively charged or negatively charged.

The particles 50 are dispersed in a dispersing fluid 25. The dispersing fluid 25 should have a low dielectric constant. The fluid 25 may be clear, or substantially clear, so that the fluid 25 does not inhibit viewing the particles 50 and the electrodes 30, 40 from position 10. In other embodiments, the fluid 25 is dyed. In some embodiments the dispersing fluid 25 has a specific gravity matched to the density of the particles 50. These embodiments can provide a bistable display media, because the particles 50 do not tend to move in certain compositions absent an electric field applied via the electrodes 30, 40.

Figure 1C:
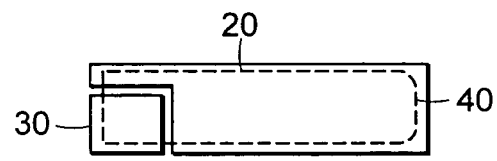
FIG. 1C is a diagrammatic top-down view of one embodiment of a rear-addressing electrode structure.

The electrodes 30, 40 should be sized and positioned appropriately so that together they address the entire capsule 20. There may be exactly one pair of electrodes 30, 40 per capsule 20, multiple pairs of electrodes 30, 40 per capsule 20, or a single pair of electrodes 30, 40 may span multiple capsules 20. In the embodiment shown in FIGS. 1A and 1B, the capsule 20 has a flattened, rectangular shape. In these embodiments, the electrodes 30, 40 should address most, or all, of the flattened surface area adjacent the electrodes 30, 40. The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40. It should be noted that reference to "smaller" in connection with the electrode 30 means that the electrode 30 addresses a smaller amount of the surface area of the capsule 20, not necessarily that the electrode 30 is physically smaller than the larger electrode 40. For example, multiple capsules 20 may be positioned such that less of each capsule 20 is addressed by the "smaller" electrode 30, even though both electrodes 30, 40 are equal in size. It should also be noted that, as shown in FIG. 1C, electrode 30 may address only a small corner of a rectangular capsule 20 (shown in phantom view in FIG. 1C), requiring the larger electrode 40 to surround the smaller electrode 30 on two sides in order to properly address the capsule 20. Selection of the percentage volume of the particles 50 and the electrodes 30, 40 in this manner allow the encapsulated display media to be addressed as described below.

Electrodes may be fabricated from any material capable of conducting electricity so that electrode 30, 40 may apply an electric field to the capsule 20. As noted above, the rear-addressed embodiments depicted in FIGS. 1A and 1B allow the electrodes 30, 40 to be fabricated from opaque materials such as solder paste, copper, copper-clad polyimide, graphite inks, silver inks and other metal-containing conductive inks. Alternatively, electrodes may be fabricated using transparent materials such as indium tin oxide and conductive polymers such as polyaniline or polythiopenes. Electrodes 30, 40 may be provided with contrasting optical properties. In some embodiments, one of the electrodes has an optical property complementary to optical properties of the particles 50. Alternatively, since the electrodes need not be transparent, an electrode can be constructed so as to display a selected color.

In one embodiment, the capsule 20 contains positively charged black particles 50, and a substantially clear suspending fluid 25. The first, smaller electrode 30 is colored black, and is smaller than the second electrode 40, which is colored white or is highly reflective. When the smaller, black electrode 30 is placed at a negative voltage potential relative to larger, white electrode 40, the positively-charged particles 50 migrate to the smaller, black electrode 30. The effect to a viewer of the capsule 20 located at position 10 is a mixture of the larger, white electrode 40 and the smaller, black electrode 30, creating an effect which is largely white. Referring to FIG. 1B, when the smaller, black electrode 30 is placed at a positive voltage potential relative to the larger, white electrode 40, particles 50 migrate to the larger, white electrode 40 and the viewer is presented a mixture of the black particles 50 covering the larger, white electrode 40 and the smaller, black electrode 30, creating an effect which is largely black. In this manner the capsule 20 may be addressed to display either a white visual state or a black visual state.

Other two-color schemes are easily provided by varying the color of the smaller electrode 30 and the particles 50 or by varying the color of the larger electrode 40. For example, varying the color of the larger electrode 40 allows fabrication of a rear-addressed, two-color display having black as one of the colors. Alternatively, varying the color of the smaller electrode 30 and the particles 50 allow a rear-addressed two-color system to be fabricated having white as one of the colors. Further, it is contemplated that the particles 50 and the smaller electrode 30 can be different colors. In these embodiments, a two-color display may be fabricated having a second color that is different from the color of the smaller electrode 30 and the particles 50. For example, a rear-addressed, orange-white display may be fabricated by providing blue particles 50, a red, smaller electrode 30, and a white (or highly reflective) larger electrode 40. In general, the optical properties of the electrodes 30, 40 and the particles 50 can be independently selected to provide desired display characteristics. In some embodiments the optical properties of the dispersing fluid 25 may also be varied, e.g. the fluid 25 may be dyed.

Figure 1D:
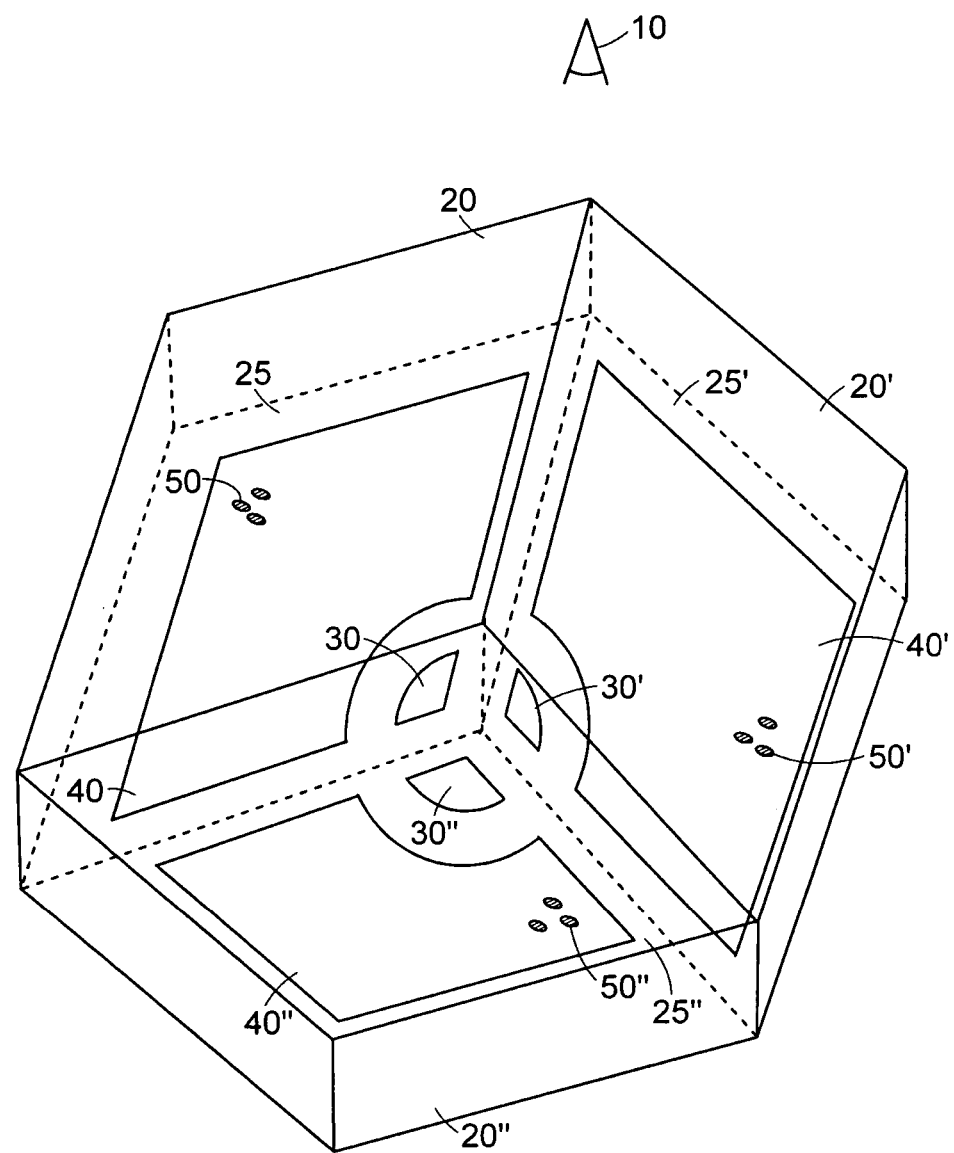
FIG. 1D is a diagrammatic perspective view of one embodiment of a display element having three sub-pixels, each sub-pixel comprising a relatively larger rear electrode and a relatively smaller rear electrode.

In another embodiment, this technique may be used to provide a full color display. Referring now to FIG. 1D, a pixel embodiment is depicted that comprises three sub-pixels. It should be understood that although FIG. 1D depicts a hexagonal pixel having equally-sized sub-pixels, a pixel may have any shape and may be comprised of unequal sub-pixels. The sub-pixels may each be contained in a single large capsule, or each may be distributed across any number of small microcapsules or microcells. For the purposed of illustration, the simpler case of a single large sub-cell for each sub-pixel is shown. In both cases we refer to the regions, 20, 20', 20", as capsules. Thus, a first capsule 20 contains positively charged black particles 50 and a substantially clear suspending fluid 25. A first, smaller electrode 30 is colored black, and is smaller than the second electrode 40, which is colored red. When the smaller, black electrode 30 is placed at a negative voltage potential relative to larger, red electrode 40, the positively-charged particles 50 migrate to the smaller, black electrode 30. The effect to a viewer of the capsule 20 located at position 10 is a mixture of the larger, red electrode 40 and the smaller, black electrode 30, creating an effect which is largely red. When the smaller, black electrode 30 is placed at a positive voltage potential relative to the larger, red electrode 40, particles 50 migrate to the larger, red electrode 40 and the viewer is presented a mixture of the black particles 50 covering the larger, red electrode 40 and the smaller, black electrode 30, creating an effect which is largely black. In this manner the first capsule 20 may be addressed to display either a red visual state or a black visual state. One can equally have a second capsule 20' wherein the larger electrode 40' is green, and a third capsule 20" wherein the larger electrode 40" is blue. A second capsule 20' contains positively charged black particles 50' and a substantially clear suspending fluid 25'. A first, smaller electrode 30' is colored black, and is smaller than the second electrode 40', which is colored green. When the smaller, black electrode 30' is placed at a negative voltage potential relative to larger, green electrode 40', the positively-charged particles 50' migrate to the smaller, black electrode 30'. The effect to a viewer of the capsule 20' located at position 10' is a mixture of the larger, green electrode 40' and the smaller, black electrode 30', creating an effect which is largely green. When the smaller, black electrode 30' is placed at a positive voltage potential relative to the larger, green electrode 40', particles 50' migrate to the larger, green electrode 40' and the viewer is presented a mixture of the black particles 50' covering the larger, green electrode 40' and the smaller, black electrode 30', creating an effect which is largely black. Similarly, a third capsule 20" contains positively charged black particles 50" and a substantially clear suspending fluid 25". A first, smaller electrode 30" is colored black, and is smaller than the second electrode 40", which is colored blue. When the smaller, black electrode 30" is placed at a negative voltage potential relative to larger, blue electrode 40", the positively-charged particles 50" migrate to the smaller, black electrode 30". The effect to a viewer of the capsule 20" located at position 10" is a mixture of the larger, blue electrode 40" and the smaller, black electrode 30", creating an effect which is largely blue. When the smaller, black electrode 30" is placed at a positive voltage potential relative to the larger, blue electrode 40", particles 50" migrate to the larger, blue electrode 40" and the viewer is presented a mixture of the black particles 50" covering the larger, blue electrode 40" and the smaller, black electrode 30", creating an effect which is largely black. Further, the relative intensities of these colors can be controlled by the actual voltage potentials applied to the electrodes. By choosing appropriate combinations of the three colors, one may create a visual display which appears as the effective combination of the selected colors as an additive process. As an alternative embodiment, the first, second and third capsules can have larger electrodes 40, 40', 40" which are respectively colored cyan, yellow, and magenta. Operation of the alternative cyan, yellow, and magenta embodiment is analogous to that of the red, green, and blue embodiment, with the feature that the color to be displayed is selected by a subtractive process.

Figure 2A:
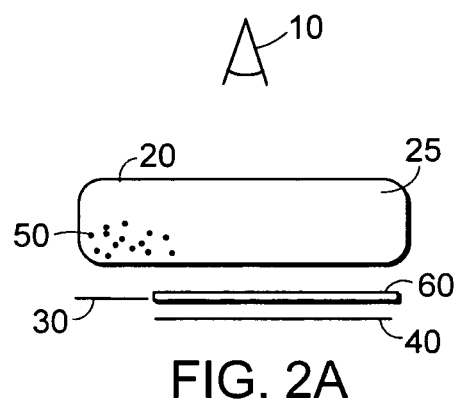
FIG. 2A is a diagrammatic side view of an embodiment of a rear-addressing electrode structure having a retroreflective layer associated with the larger electrode in which the smaller electrode has been placed at a voltage relative to the large electrode causing the particles to migrate to the smaller electrode.
Figure 2B:
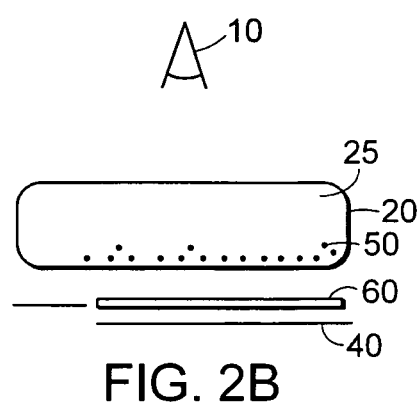
FIG. 2B is a diagrammatic side view of an embodiment of a rear-addressing electrode structure having a retroreflective layer associated with the larger electrode in which the larger electrode has been placed at a voltage relative to the smaller electrode causing the particles to migrate to the larger electrode.
Figure 2C:
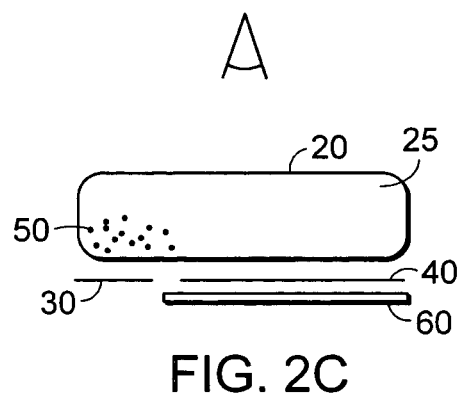
FIG. 2C is a diagrammatic side view of an embodiment of a rear-addressing electrode structure having a retroreflective layer disposed below the larger electrode in which the smaller electrode has been placed at a voltage relative to the large electrode causing the particles to migrate to the smaller electrode.
Figure 2D:
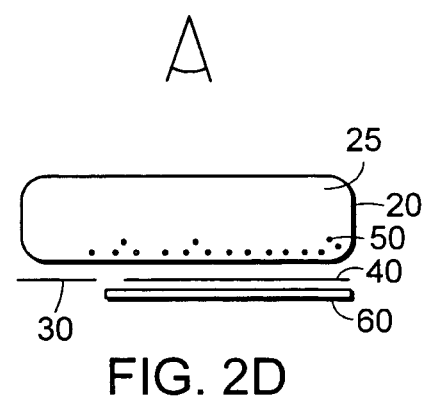
FIG. 2D is a diagrammatic side view of an embodiment of a rear-addressing electrode structure having a retroreflective layer disposed below the larger electrode in which the larger electrode has been placed at a voltage relative to the smaller electrode causing the particles to migrate to the larger electrode.

In other embodiments the larger electrode 40 may be reflective instead of white. In these embodiments, when the particles 50 are moved to the smaller electrode 30, light reflects off the reflective surface 60 associated with the larger electrode 40 and the capsule 20 appears light in color, e.g. white (see FIG. 2A). When the particles 50 are moved to the larger electrode 40, the reflecting surface 60 is obscured and the capsule 20 appears dark (see FIG. 2B) because light is absorbed by the particles 50 before reaching the reflecting surface 60. The reflecting surface 60 for the larger electrode 40 may possess retroreflective properties, specular reflection properties, diffuse reflective properties or gain reflection properties. In certain embodiments, the reflective surface 60 reflects light with a Lambertian distribution The surface 60 may be provided as a plurality of glass spheres disposed on the electrode 40, a diffractive reflecting layer such as a holographically formed reflector, a surface patterned to totally internally reflect incident light, a brightness-enhancing film, a diffuse reflecting layer, an embossed plastic or metal film, or any other known reflecting surface. The reflecting surface 60 may be provided as a separate layer laminated onto the larger electrode 40 or the reflecting surface 60 may be provided as a unitary part of the larger electrode 40. In the embodiments depicted by FIGS. 2C and 2D, the reflecting surface may be disposed below the electrodes 30, 40 vis-á-vis the viewpoint 10. In these embodiments, electrode 30 should be transparent so that light may be reflected by surface 60. In other embodiments, proper switching of the particles may be accomplished with a combination of alternating-current (AC) and direct-current (DC) electric fields and described below in connection with FIGS. 3A-3D.

In still other embodiments, the rear-addressed display previously discussed can be configured to transition between largely transmissive and largely opaque modes of operation (referred to hereafter as "shutter mode"). Referring back to FIGS. 1A and 1B, in these embodiments the capsule 20 contains at least one positively-charged particle 50 dispersed in a substantially clear dispersing fluid 25. The larger electrode 40 is transparent and the smaller electrode 30 is opaque. When the smaller, opaque electrode 30 is placed at a negative voltage potential relative to the larger, transmissive electrode 40, the particles 50 migrate to the smaller, opaque electrode 30. The effect to a viewer of the capsule 20 located at position 10 is a mixture of the larger, transparent electrode 40 and the smaller, opaque electrode 30, creating an effect which is largely transparent. Referring to FIG. 1B, when the smaller, opaque electrode 30 is placed at a positive voltage potential relative to the larger, transparent electrode 40, particles 50 migrate to the second electrode 40 and the viewer is presented a mixture of the opaque particles 50 covering the larger, transparent electrode 40 and the smaller, opaque electrode 30, creating an effect which is largely opaque. In this manner, a display formed using the capsules depicted in FIGS. 1A and 1B may be switched between transmissive and opaque modes. Such a display can be used to construct a window that can be rendered opaque. Although FIGS. 1A-2D depict a pair of electrodes associated with each capsule 20, it should be understood that each pair of electrodes may be associated with more than one capsule 20.

Figure 3A:
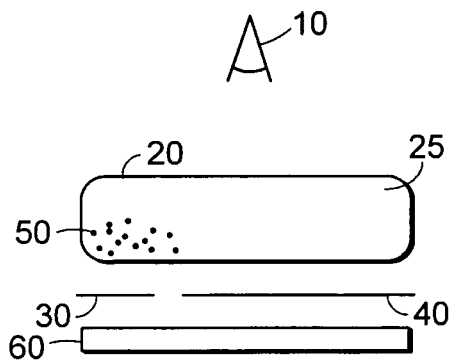
FIG. 3A is a diagrammatic side view of an embodiment of an addressing structure in which a direct-current electric field has been applied to the capsule causing the particles to migrate to the smaller electrode.

A similar technique may be used in connection with the embodiment of FIGS. 3A, 3B, 3C, and 3D. Referring to FIG. 3A, a capsule 20 contains at least one dark or black particle 50 dispersed in a substantially clear dispersing fluid 25. A smaller, opaque electrode 30 and a larger, transparent electrode 40 apply both direct-current (DC) electric fields and alternating-current (AC) fields to the capsule 20. A DC field can be applied to the capsule 20 to cause the particles 50 to migrate towards the smaller electrode 30. For example, if the particles 50 are positively charged, the smaller electrode is placed a voltage that is more negative than the larger electrode 40. Although FIGS. 3A-3D depict only one capsule per electrode pair, multiple capsules may be addressed using the same electrode pair.

The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40.

Causing the particles 50 to migrate to the smaller electrode 30, as depicted in FIG. 3A, allows incident light to pass through the larger, transparent electrode 40 and be reflected by a reflecting surface 60. In shutter mode, the reflecting surface 60 is replaced by a translucent layer, a transparent layer, or a layer is not provided at all, and incident light is allowed to pass through the capsule 20, i.e. the capsule 20 is transmissive. If the translucent layer or the transparent layer comprises a color, such as a color filter, the light which is transmitted will be those wavelengths that the filter passes, and the reflected light will consist of those wavelengths that the filter reflects, while the wavelengths that the filter absorbs will be lost. The visual appearance of a shutter mode display may thus depend on whether the display is in a transmissive or reflective condition, on the characteristics of the filter, and on the position of the viewer.

Figure 3B:
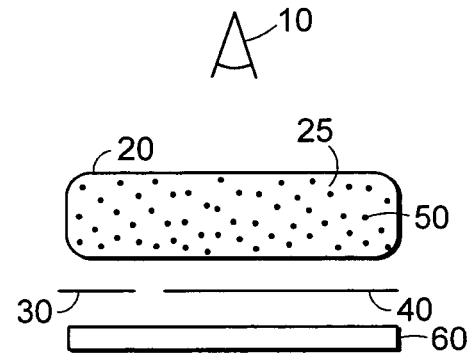
FIG. 3B is a diagrammatic side view of an embodiment of an addressing structure in which an alternating-current electric field has been applied to the capsule causing the particles to disperse into the capsule, obscuring a rear substrate.

Referring now to FIG. 3B, the particles 50 are dispersed into the capsule 20 by applying an AC field to the capsule 20 via the electrodes 30, 40. The particles 50, dispersed into the capsule 20 by the AC field, block incident light from passing through the capsule 20, causing it to appear dark at the viewpoint 10. The embodiment depicted in FIGS. 3A-3B may be used in shutter mode by not providing the reflecting surface 60 and instead providing a translucent layer, a transparent layer, a color filter layer, or no layer at all. In shutter mode, application of an AC electric field causes the capsule 20 to appear opaque. The transparency of a shutter mode display formed by the apparatus depicted in FIGS. 3A-3D may be controlled by the number of capsules addressed using DC fields and AC fields. For example, a display in which every other capsule 20 is addressed using an AC field would appear fifty percent transmissive.

Figure 3C:
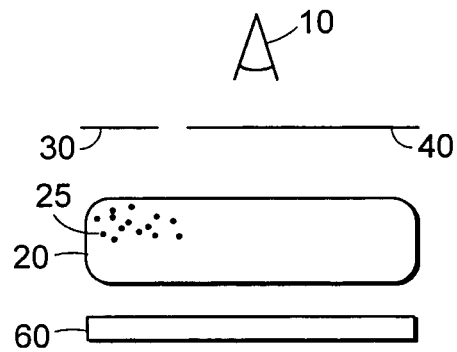
FIG. 3C is a diagrammatic side view of an embodiment of an addressing structure having transparent electrodes, in which a direct-current electric field has been applied to the capsule causing the particles to migrate to the smaller electrode, revealing a rear substrate.
Figure 3D:
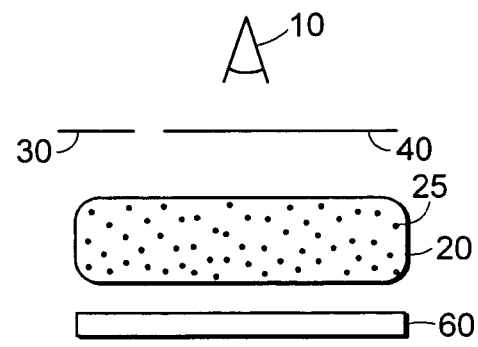
FIG. 3D is a diagrammatic side view of an embodiment of an addressing structure having transparent electrodes, in which an alternating-current electric field has been applied to the capsule causing the particles to disperse into the capsule.

FIGS. 3C and 3D depict an embodiment of the electrode structure described above in which electrodes 30, 40 are on "top" of the capsule 20, that is, the electrodes 30, 40 are between the viewpoint 10 and the capsule 20. In these embodiments, both electrodes 30, 40 should be transparent. Transparent polymers can be fabricated using conductive polymers, such as polyaniline, polythiophenes, or indium tin oxide. These materials may be made soluble so that electrodes can be fabricated using coating techniques such as spin coating, spray coating, meniscus coating, printing techniques, forward and reverse roll coating and the like. In these embodiments, light passes through the electrodes 30, 40 and is either absorbed by the particles 50, reflected by retroreflecting layer 60 (when provided), transmitted throughout the capsule 20 (when retroreflecting layer 60 is not provided), or partially transmitted and/or reflected if a color filter is present in place of retroreflecting layer 60.

Figure 3E:
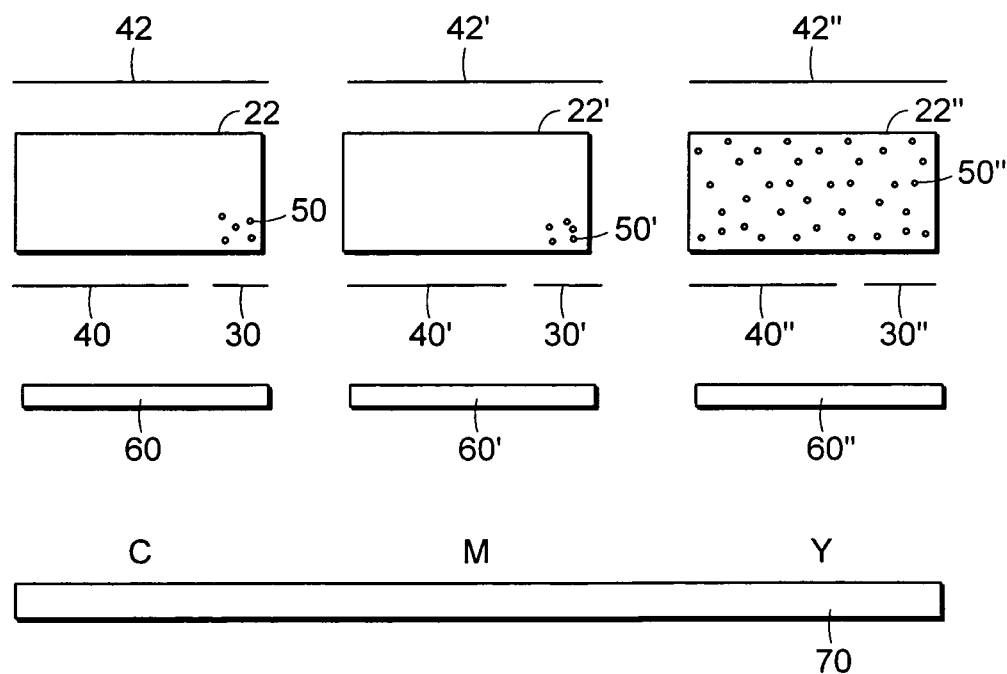
FIG. 3E is a diagrammatic side view of an embodiment of an addressing structure for a display element having three sub-pixels.

Referring to FIG. 3E, three sub-pixel capsules 22, 22' and 22" each contain at least one white particle 50 dispersed in a substantially clear dispersing fluid 25. In one embodiment, each sub-pixel capsule 22, 22' and 22" has a transparent electrode 42, 42', and 42" disposed above it and a colored filter 60, 60' and 60" disposed below it. A common reflective surface 70 may be shared behind the color filter layer. In an alternative embodiment, the display includes an emissive light source 70

Smaller, opaque electrodes 30, 30' and 30" and Larger, transparent electrodes 40, 40' and 40" may apply direct-current (DC) electric fields and alternating-current (AC) fields to the capsules 20, 20' and 20". A DC field can be applied to the capsules 20, 20' and 20" to cause the particles 50, 50' 50" to migrate towards the smaller electrodes 30, 30' and 30". For example, if the particles 50, 50' and 50" are positively charged, the smaller electrodes 30, 30' and 30" are placed a voltage that is more negative than the larger electrodes 40, 40' and 40".

The smaller electrode 30 is at most one-half the size of the larger electrode 40. In preferred embodiments the smaller electrode 30 is one quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40.

Causing the particles 50 to migrate to the smaller electrode 30, as depicted in the first two capsules of FIG. 3E, allows incident light to pass through the larger, transparent electrode 40 filter 60 and reflect off substrate 70. If the first, second and third filters 60, 60' and 60" are colored cyan, magenta, and yellow respectively, and the particles 50 are white, this system can display full color in a standard two-color fashion.

The filter layer 60 may be a translucent layer, a transparent layer, a color filter layer, or a layer is not provided at all, and further substrate 70 may be reflective, emissive, translucent or not provided at all. If the layer 60 comprises a color, such as a color filter, the light which is transmitted will be those wavelengths that the filter passes, and the reflected light will consist of those wavelengths that the filter reflects, while the wavelengths that the filter absorbs will be lost. The visual appearance of a the display element in 3E may thus depend on whether the display is in a transmissive or reflective condition, on the characteristics of the filter, and on the position of the viewer. In an alternative embodiment layer 60 may be provided on top of the capsule adjacent to electrode 42.

Figure 3F:
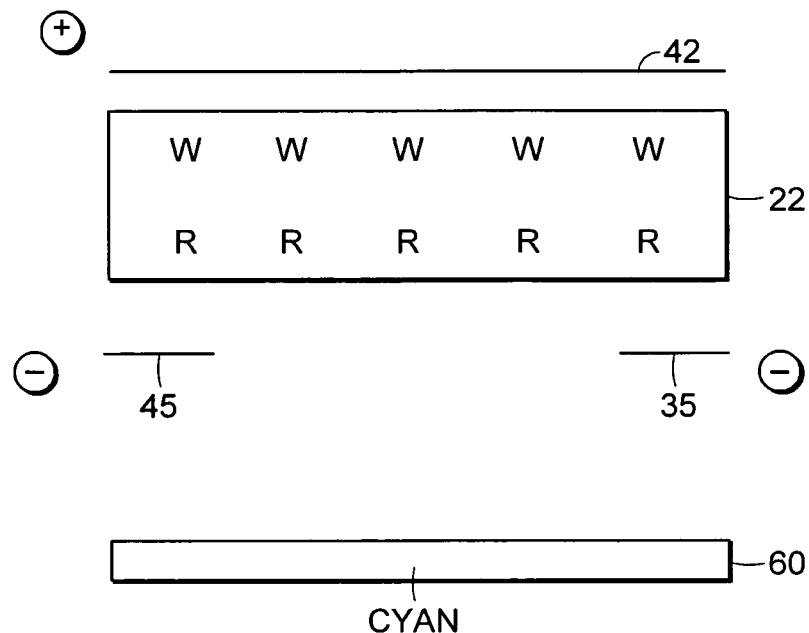
FIG. 3F is a diagrammatic side view of an embodiment of a dual particle curtain mode addressing structure addressing a display element to appear white.
Figure 3G:
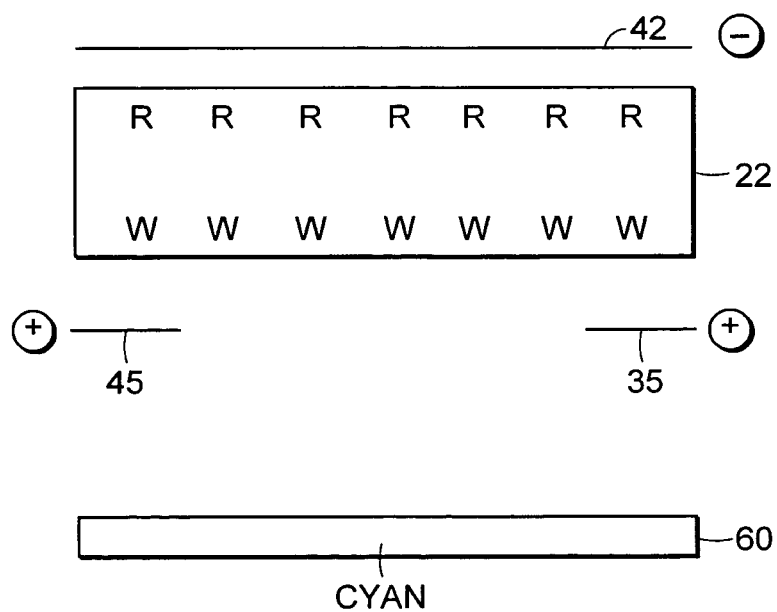
FIG. 3G is a diagrammatic side view of an embodiment of a dual particle curtain mode addressing structure addressing a display element to appear red.
Figure 3H:
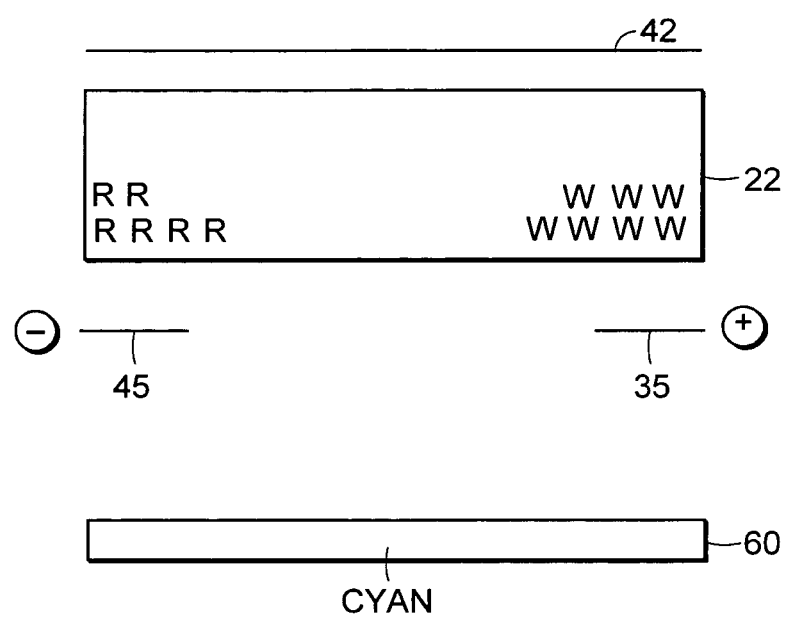
FIG. 3H is a diagrammatic side view of an embodiment of a dual particle curtain mode addressing structure addressing a display element to absorb red light.

Referring now to FIGS. 3F-3K, one embodiment of a tricolor pixel is described. Clear electrode 42 allows light to pass into capsule 22 and to strike either white particles W, red particles R, or a colored substrate 60. The substrate 60 can be a combination of color filter and non-colored substrate or it can be provided as a unitary colored substrate. Capsule 22 also includes a suspending fluid that can be dye-colored (possibly eliminating the need for a separate color filter 60) or substantially clear. Electrodes 45 and 35 are transparent and may be equally sized or sized in any suitable manner taking into account the relative particles sizes and mobilities of particles W and R. A gap exists between 45 and 35. Assume that particles W are negatively charged and particles R are positively charged. In FIG. 3F, top electrode 42 is set at a positive voltage potential relative to bottom electrodes 35 and 45, moving particles W to the top and particles R to the bottom and thus white is displayed. In FIG. 3G by reversing the polarity of the electrodes, red is displayed. In both FIGS. 3F and 3G the particles obscure substrate 60. In FIG. 3H electrode 45 is at a negative voltage potential relative to electrode 35, while electrode 42 is at a voltage potential between the potentials of 45 and 35, such as zero. Alternatively, electrode 42 switches between the potentials of 45 and 35 so that over time the effective voltage of 42 is again between the potentials of 45 and 35. In this state, the particles R move toward electrode 45 and the particles W move toward electrode 35 and both particles R and W move away from the gap in the center of the capsule 22. This reveals substrate 60, permitting a third color such as cyan to be imaged. In alternate embodiments the color combinations can differ. The specific colors of the filters and particles need not differ. This system, called "dual particle curtain mode," can image three arbitrary colors. In a preferred embodiment the colors are as described wherein one color is white and the other two colors are complements. In this manner, referring again to FIG. 3H, if a small portion of red is visible it absorbs part of the light reflected from the cyan substrate and the net result is black, which may be offset by a small portion of visible white. Thus, the pixel in FIG. 3H may appear to be cyan even if some red and white is visible. As mentioned above, the edges of the pixel may be masked to hide particles R and W when in the mode shown in FIG. 3H.

Figure 3I:
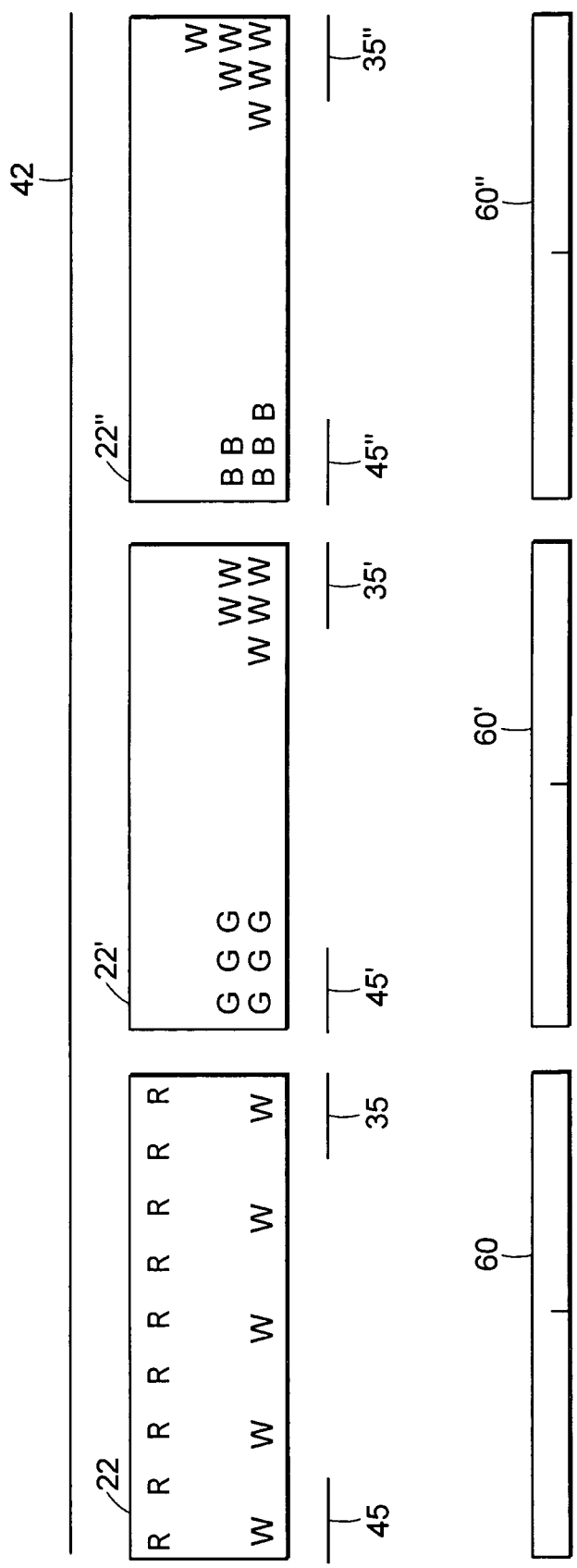
FIG. 3I is a diagrammatic side view of an embodiment of a dual particle curtain mode addressing structure for a display element having three sub-pixels, in which the display is addressed to appear red.

Referring now to FIG. 3I, a full-color pixel is shown comprising three sub-pixels, each operating in the manner taught by FIGS. 3F-3H wherein the colored particles are positively charged, and the white particles are negatively charged. The system may still function with top electrode 42 extended as a common top electrode as shown in FIG. 3I. For example, to achieve the state shown, electrodes 42, 45, 35, 45', 35', 45", 35" may be set to voltage potentials −30V, 60V, 60V, −60V, +60V, −60V, +60V respectively.

Figure 3J:
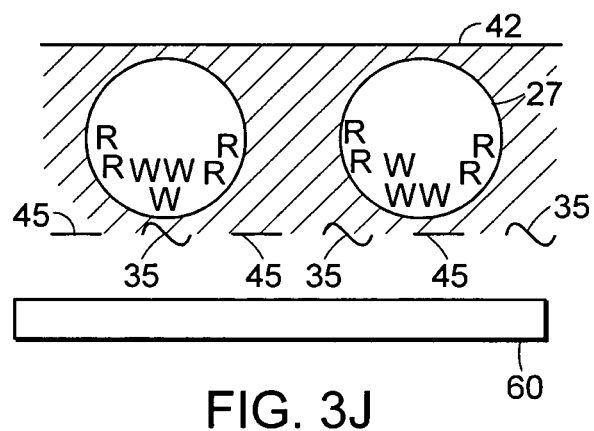
FIG. 3J is a diagrammatic side view of another embodiment of a dual particle curtain mode addressing structure for a display element.
Figure 3K:
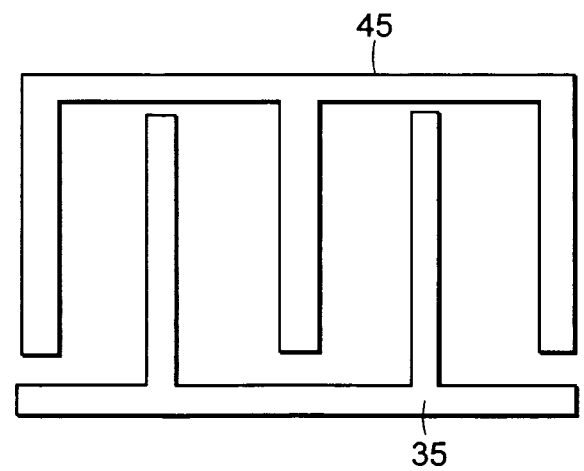
FIG. 3K is a diagrammatic plan view of an embodiment of an interdigitated electrode structure.

Referring now to FIGS. 3J-3K, an electrode scheme is shown whereby a cluster of microcapsules may be addressed for an entire sub-pixel in a manner similar to those described above. Clear electrode 42 allows light to pass into microcapsules 27 and to strike either white particles W, red particles R, or colored substrate 60. As above, colored substrate 60 may be a combination of color filter and non-colored substrate 60 or colored substrate 60 may be provided as a unitary colored substrate. Capsules 27 include a suspending fluid that may be dye-colored (possibly eliminating the need for a separate color filter 60) or substantially clear. Electrodes 45 and 35 are transparent and may be equally sized or sized in any suitable manner taking into account the relative particle sizes and mobilities of particles W and R. A gap exists between 45 and 35. Assume that particles W are negatively charged and particles R are positively charged. The system operates in the manner described in FIGS. 3F-3K, although for any given microcapsule 27 there may be multiple gaps. FIG. 3K illustrates an embodiment of a suitable electrode pattern in which 45 and 35 are interdigitated.

Figure 3L:
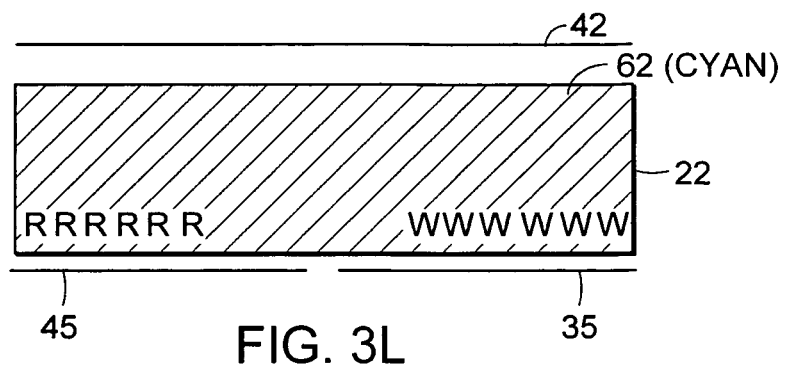
FIG. 3L is a diagrammatic side view of another embodiment of a dual particle curtain mode display structure having a dyed fluid and two species of particles, addressed to absorb red.
Figure 3M:
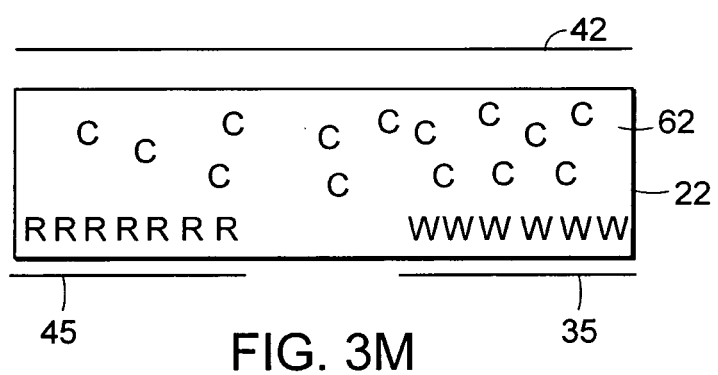
FIG. 3M is a diagrammatic side view of another embodiment of a dual particle curtain mode display structure having clear fluid and three species of particles, addressed to absorb red.

Referring now to 3L-3M, an alternate embodiment is shown. Again clear electrode 42 allows light to pass into capsule 22 and to strike white particles W or red particles R. In the embodiment shown in FIG. 3L, capsule 22 includes a suspending fluid 62 that is dyed cyan. When electrodes 45 and 35 are set at appropriate voltages particles, R and W move down to electrodes 45 and 35 respectively, where they are obscured by light-absorbing suspending fluid 62. Alternatively, as shown in FIG. 3M, suspending fluid 62 is substantially clear and a third species of cyan particles C is included in capsules 22. The cyan particles have a relatively neutral charge. When electrodes 45 and 35 are set at appropriate voltages particles R and W move down to electrodes 45 and 35 respectively, revealing the cyan particles.

The addressing structure depicted in FIGS. 3A-3M may be used with electrophoretic display media and encapsulated electrophoretic display media FIGS. 3A-3M depict embodiments in which electrode 30, 40 are statically attached to the display media. In certain embodiments, the particles 50 exhibit bistability, that is, they are substantially motionless in the absence of a electric field.

While various of the substrates described above are reflective, an analogous technique may be employed wherein the substrates emit light, with the particles again acting in a "shutter mode" to reveal or obscure light. A preferred substrate for this use is an electroluminiscent (EL) backlight. Such a backlight can be reflective-when inactive, often with a whitish-green color, yet emit lights in various wavelengths when active. By using whitish EL substrates in place of static white reflective substrates, it is possible to construct a full-color reflective display that can also switch its mode of operation to display a range of colors in an emissive state, permitting operation in low ambient light conditions.

Figure 4A:
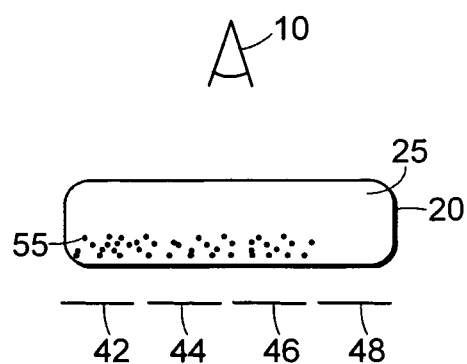
FIG. 4A is a diagrammatic side view of an embodiment of a rear-addressing electrode structure for a particle-based display having colored electrodes and a white electrode, in which the colored electrodes have been placed at a voltage relative to the white electrode causing the particles to migrate to the colored electrodes.
Figure 4B:
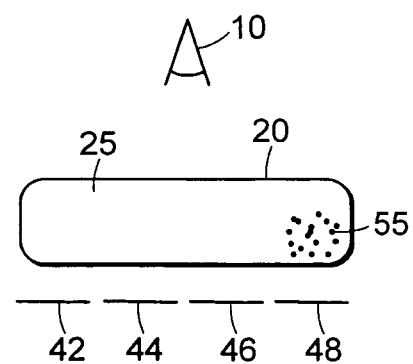
FIG. 4B is a diagrammatic side view of an embodiment of a rear-addressing electrode structure for a particle-based display having colored electrodes and a white electrode, in which the white electrode has been placed at a voltage relative to the colored electrodes causing the particles to migrate to the white electrode.

FIGS. 4A and 4B depict an embodiment of a rear-addressing electrode structure that creates a reflective color display in a manner similar to halftoning or pointillism. The capsule 20 contains white particles 55 dispersed in a clear suspending fluid 25. Electrodes 42, 44, 46, 48 are colored cyan, magenta, yellow, and white respectively. Referring to FIG. 4A, when the colored electrodes 42, 44, 46 are placed at a positive potential relative to the white electrode 48, negatively-charged particles 55 migrate to these three electrodes, causing the capsule 20 to present to the viewpoint 10 a mix of the white particles 55 and the white electrode 48, creating an effect which is largely white. Referring to FIG. 4B, when electrodes 42, 44, 46 are placed at a negative potential relative to electrode 48, particles 55 migrate to the white electrode 48, and the eye 10 sees a mix of the white particles 55, the cyan electrode 42, the magenta electrode 44, and the yellow electrode 46, creating an effect which is largely black or gray. By addressing the electrodes, any color can be produced that is possible with a subtractive color process. For example, to cause the capsule 20 to display a red color to the viewpoint 10, the yellow electrode 46 and the magenta electrode 42 are set to a voltage potential that is more positive than the voltage potential applied by the cyan electrode 42 and the white electrode 48. Further, the relative intensities of these colors can be controlled by the actual voltage potentials applied to the electrodes. Again, AC current may be used appropriately to randomize the position of the particles as a step in this process.

The technique used in FIGS. 4A and 4B could be used in a similar manner with fewer electrodes and controlling fewer colors. For example, if electrode 42 were not present, the pixel could still display three colors. If electrodes 44 and 46 were colored red and cyan respectively, the capsule could display red, cyan and white. This construction could be used then employed as a sub-pixel, to be matched with similar sub-pixels displaying other trios of colors thus achieving a full-color display as described above.

Figure 5:
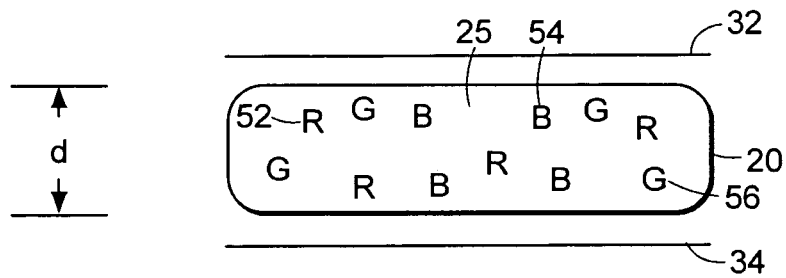
FIG. 5 is a diagrammatic side view of an embodiment of a color display element having red, green, and blue particles of different electrophoretic mobilities.

In another embodiment, depicted in FIG. 5, a color display is provided by a capsule 20 of size d containing multiple species of particles in a clear, dispersing fluid 25. Each species of particles has different optical properties and possess different electrophoretic mobilities ($\mu$) from the other species.

In the embodiment depicted in FIG. 5, the capsule 20 contains red particles 52, blue particles 54, and green particles 56, and $$|\mu_R| > |\mu^B| > |\mu_G|$$

That is, the magnitude of the electrophoretic mobility of the red particles 52, on average, exceeds the electrophoretic mobility of the blue particles 54, on average, and the electrophoretic mobility of the blue particles 54, on average, exceeds the average electrophoretic mobility of the green particles 56. As an example, there may be a species of red particle with a zeta potential of 100 millivolts (mV), a blue particle with a zeta potential of 60 mV, and a green particle with a zeta potential of 20 mV. The capsule 20 is placed between two electrodes 32, 42 that apply an electric field to the capsule. By addressing the capsule 20 with positive and negative voltage fields of varying time durations, it is possible to move any of the various particle species to the top of the capsule to present a certain color.

Figure 6A:
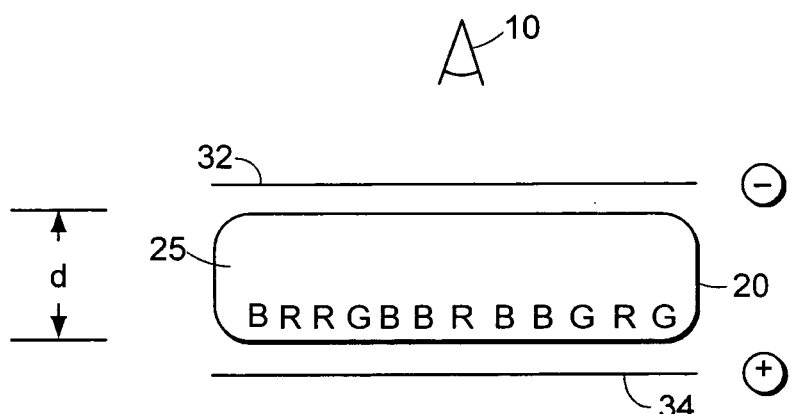
FIGS. 6A-6B depict the steps taken to address the display of FIG. 5 to display red.
Figure 6B:
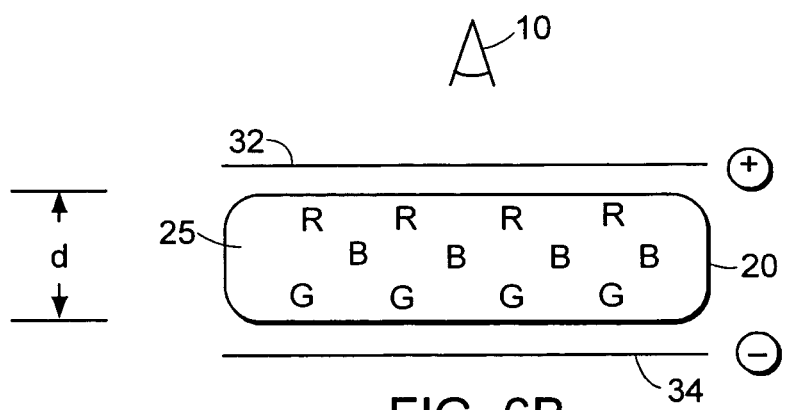

FIGS. 6A-6B depict the steps to be taken to address the display shown in FIG. 5 to display a red color to a viewpoint 10. Referring to FIG. 6A, all the particles 52, 54, 56 are attracted to one side of the capsule 20 by applying an electric field in one direction. The electric field should be applied to the capsule 20 long enough to attract even the more slowly moving green particles 56 to the electrode 34. Referring to FIG. 6B, the electric field is reversed just long enough to allow the red particles 52 to migrate towards the electrode 32. The blue particles 54 and green particles 56 will also move in the reversed electric field, but they will not move as fast as the red particles 52 and thus will be obscured by the red particles 52. The amount of time for which the applied electric field must be reversed can be determined from the relative electrophoretic mobilities of the particles, the strength of the applied electric field, and the size of the capsule.

Figure 7A:
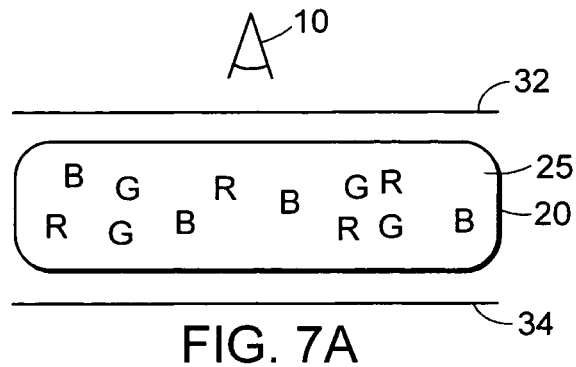
FIGS. 7A-7D depict the steps taken to address the display of FIG. 5 to display blue.
Figure 7B:
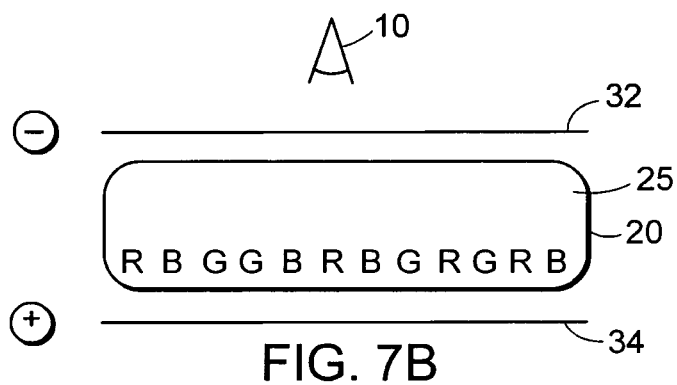
Figure 7C:
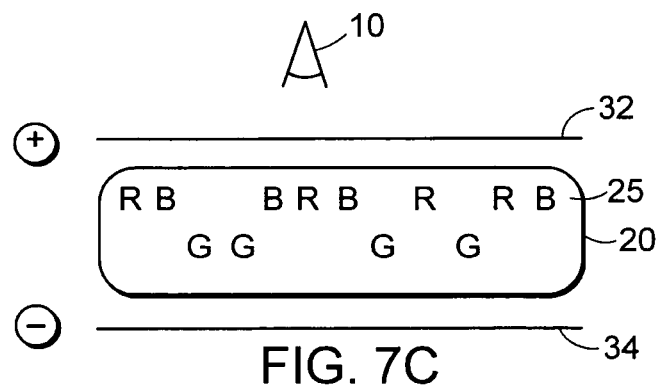
Figure 7D:
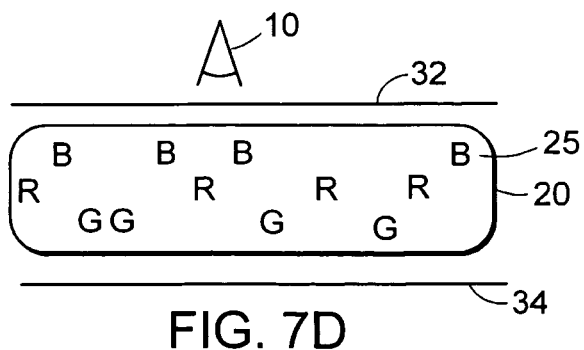

FIGS. 7A-7D depict addressing the display element to a blue state. As shown in FIG. 7A, the particles 52, 54, 56 are initially randomly dispersed in the capsule 20. All the particles 52, 54, 56 are attracted to one side of the capsule 20 by applying an electric field in one direction (shown in FIG. 7B). Referring to FIG. 7C, the electric field is reversed just long enough to allow the red particles 52 and blue particles 54 to migrate towards the electrode 32. The amount of time for which the applied electric field must be reversed can be determined from the relative electrophoretic mobilities of the particles, the strength of the applied electric field, and the size of the capsule. Referring to FIG. 7D, the electric field is then reversed a second time and the red particles 52, moving faster than the blue particles 54, leave the blue particles 54 exposed to the viewpoint 10. The amount of time for which the applied electric field must be reversed can be determined from the relative electrophoretic mobilities of the particles, the strength of the applied electric field, and the size of the capsule.

Figure 8A:
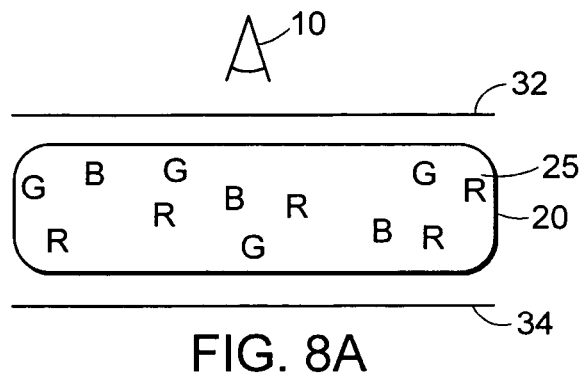
FIGS. 8A-8C depict the steps taken to address the display of FIG. 5 to display green.
Figure 8B:
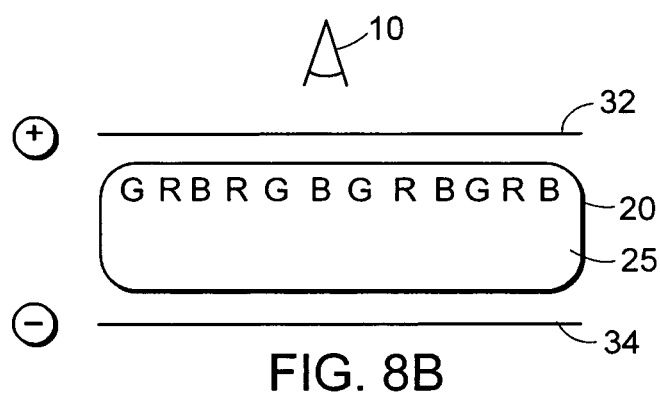
Figure 8C:
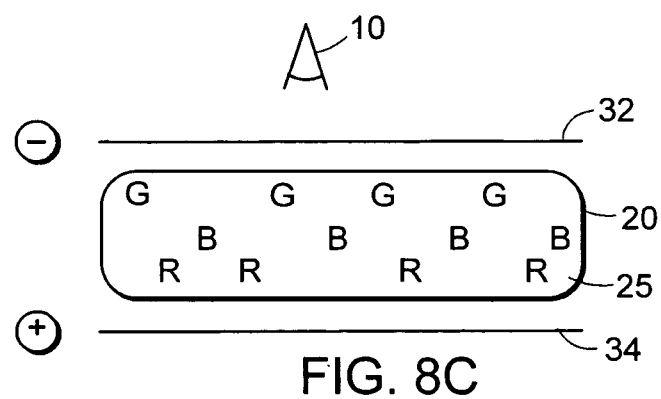

FIGS. 8A-8C depict the steps to be taken to present a green display to the viewpoint 10. As shown in FIG. 8A, the particles 52, 54, 56 are initially distributed randomly in the capsule 20. All the particles 52, 54, 56 are attracted to the side of the capsule 20 proximal the viewpoint 10 by applying an electric field in one direction. The electric field should be applied to the capsule 20 long enough to attract even the more slowly moving green particles 56 to the electrode 32. As shown in FIG. 8C, the electric field is reversed just long enough to allow the red particles 52 and the blue particles 54 to migrate towards the electrode 54, leaving the slowly-moving green particles 56 displayed to the viewpoint. The amount of time for which the applied electric field must be reversed can be determined from the relative electrophoretic mobilities of the particles, the strength of the applied electric field, and the size of the capsule.

In other embodiments, the capsule contains multiple species of particles and a dyed dispersing fluid that acts as one of the colors. In still other embodiments, more than three species of particles may be provided having additional colors. In one of these embodiments, the capsule contains white particles which have a strong positive charge, cyan particles which have a weakly positive charge, and red particles having a negative charge. Since the electrophoretic mobilities of these types of particles will be proportional to charge and of a direction related to the sign or polarity of the charge, these three types of particles will have different mobilities in the same voltage field. In this example, white is achieved when the top electrode is negative and the bottom electrode is positive. Red is achieved when the top electrode is positive and the bottom electrode is negative. Cyan is achieved by first setting the sub-pixel to white and then briefly reversing the voltage field so that the higher mobility white particles migrate past the cyan particles and the lower mobility, or slower, cyan particles remain topmost and visible. Although FIGS. 6-8C depict two electrodes associated with a single capsule, the electrodes may address multiple capsules or less than a full capsule.

The addressing structures described in FIGS. 1-8 typically comprise a top electrode controlled by display driver circuitry. It may be seen that if the top electrode is absent, the display may be imaged by an externally applied voltage source, such as a passing stylus or electrostatic print head. The means that techniques applied above to generate a full-color electrophoretic display could also be applied for a full-color electrophoretic media.

Figure 9:
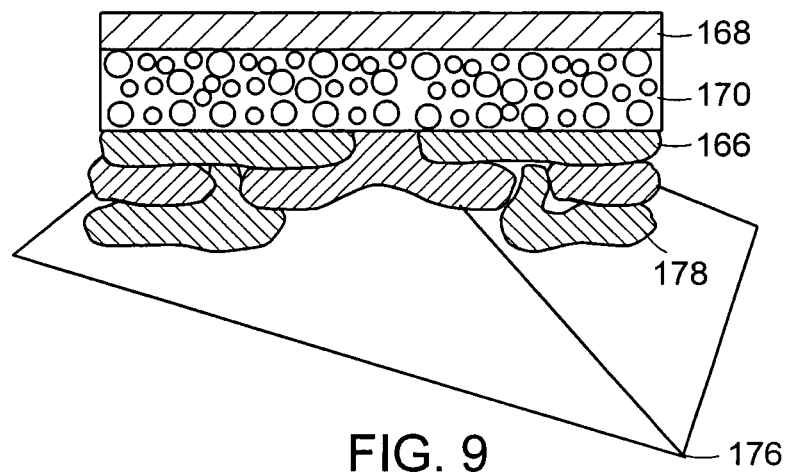
FIG. 9 is a cross-sectional view of a rear electrode addressing structure that is formed by printing.

In FIG. 9, the rear electrode structure can be made entirely of printed layers. A conductive layer 166 can be printed onto the back of a display comprised of a clear, front electrode 168 and a printable display material 170. A clear electrode may be fabricated from indium tin oxide or conductive polymers such as polyanilines and polythiophenes. A dielectric coating 176 can be printed leaving areas for vias. Then, the back layer of conductive ink 178 can be printed. If necessary, an additional layer of conductive ink can be used before the final ink structure is printed to fill in the holes.

This technique for printing displays can be used to build the rear electrode structure on a display or to construct two separate layers that are laminated together to form the display. For example an electronically active ink may be printed on an indium tin oxide electrode. Separately, a rear electrode structure as described above can be printed on a suitable substrate, such as plastic, polymer films, or glass. The electrode structure and the display element can be laminated to form a display.

Figure 10:
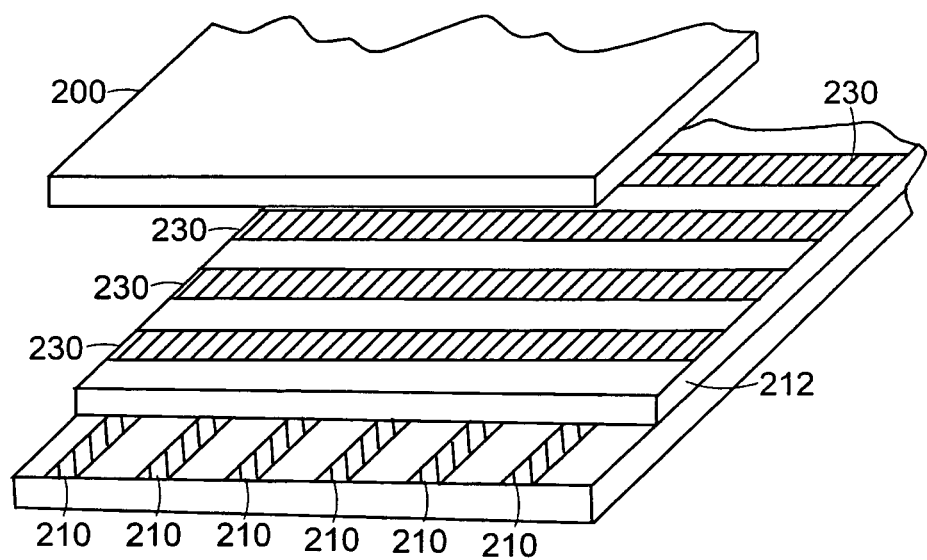
FIG. 10 is a perspective view of an embodiment of a control grid addressing structure.

Referring now to FIG. 10, a threshold may be introduced into an electrophoretic display cell by the introduction of a third electrode. One side of the cell is a continuous, transparent electrode 200 (anode). On the other side of the cell, the transparent electrode is patterned into a set of isolated column electrode strips 210. An insulator 212 covers the column electrodes 210, and an electrode layer on top of the insulator is divided into a set of isolated row electrode strips 230, which are oriented orthogonal to the column electrodes 210. The row electrodes 230 are patterned into a dense array of holes, or a grid, beneath which the exposed insulator 212 has been removed, forming a multiplicity of physical and potential wells.

A positively charged particle 50 is loaded into the potential wells by applying a positive potential (e.g. 30V) to all the column electrodes 210 while keeping the row electrodes 230 at a less positive potential (e.g. 15V) and the anode 200 at zero volts. The particle 50 may be a conformable capsule that situates itself into the physical wells of the control grid. The control grid itself may have a rectangular cross-section, or the grid structure may be triangular in profile. It can also be a different shape which encourages the microcapsules to situate in the grid, for example, hemispherical.

The anode 200 is then reset to a positive potential (e.g. 50V). The particle will remain in the potential wells due to the potential difference in the potential wells: this is called the Hold condition. To address a display element the potential on the column electrode associated with that element is reduced, e.g. by a factor of two, and the potential on the row electrode associated with that element is made equal to or greater than the potential on the column electrode. The particles in this element will then be transported by the electric field due to the positive voltage on the anode 200. The potential difference between row and column electrodes for the remaining display elements is now less than half of that in the normal Hold condition. The geometry of the potential well structure and voltage levels are chosen such that this also constitutes a Hold condition, i.e., no particles will leave these other display elements and hence there will be no half-select problems. This addressing method can select and write any desired element in a matrix without affecting the pigment in any other display element. A control electrode device can be operated such that the anode electrode side of the cell is viewed.

The control grid may be manufactured through any of the processes known in the art, or by several novel processes described herein. That is, according to traditional practices, the control grid may be constructed with one or more steps of photolithography and subsequent etching, or the control grid may be fabricated with a mask and a "sandblasting" technique.

In another embodiment, the control grid is fabricated by an embossing technique on a plastic substrate. The grid electrodes may be deposited by vacuum deposition or sputtering, either before or after the embossing step. In another embodiment, the electrodes are printed onto the grid structure after it is formed, the electrodes consisting of some kind of printable conductive material which need not be clear (e.g. a metal or carbon-doped polymer, an intrinsically conducting polymer, etc.).

In a preferred embodiment, the control grid is fabricated with a series of printing steps. The grid structure is built up in a series of one or more printed layers after the cathode has been deposited, and the grid electrode is printed onto the grid structure. There may be additional insulator on top of the grid electrode, and there may be multiple grid electrodes separated by insulator in the grid structure. The grid electrode may not occupy the entire width of the grid structure, and may only occupy a central region of the structure, in order to stay within reproducible tolerances. In another embodiment, the control grid is fabricated by photoetching away a glass, such as a photostructural glass.

In an encapsulated electrophoretic image display, an electrophoretic suspension, such as the ones described previously, is placed inside discrete compartments that are dispersed in a polymer matrix. This resulting material is highly susceptible to an electric field across the thickness of the film. Such a field is normally applied using electrodes attached to either side of the material. However, as described above in connection with FIGS. 3A-3F, some display media may be addressed by writing electrostatic charge onto one side of the display material. The other side normally has a clear or opaque electrode. For example, a sheet of encapsulated electrophoretic display media can be addressed with a head providing DC voltages.

In another embodiment, the encapsulated electrophoretic suspension can be printed onto an area of a conductive material such as a printed silver or graphite ink, aluminized mylar, or any other conductive surface. This surface which constitutes one electrode of the display can be set at ground or high voltage. An electrostatic head consisting of many electrodes can be passed over the capsules to addressing them. Alternatively, a stylus can be used to address the encapsulated electrophoretic suspension.

In another embodiment, an electrostatic write head is passed over the surface of the material. This allows very high resolution addressing. Since encapsulated electrophoretic material can be placed on plastic, it is flexible. This allows the material to be passed through normal paper handling equipment. Such a system works much like a photocopier, but with no consumables. The sheet of display material passes through the machine and an electrostatic or electrophotographic head addresses the sheet of material.

In another embodiment, electrical charge is built up on the surface of the encapsulated display material or on a dielectric sheet through frictional or triboelectric charging. The charge can built up using an electrode that is later removed. In another embodiment, charge is built up on the surface of the encapsulated display by using a sheet of piezoelectric material.

Microencapsulated displays offer a useful means of creating electronic displays, many of which can be coated or printed. There are many versions of microencapsulated displays, including microencapsulated electrophoretic displays. These displays can be made to be highly reflective, bistable, and low power.

To obtain high resolution displays, it is useful to use some external addressing means with the microencapsulated material. This invention describes useful combinations of addressing means with microencapsulated electrophoretic materials in order to obtain high resolution displays.

One method of addressing liquid crystal displays is the use of silicon-based thin film transistors to form an addressing backplane for the liquid crystal. For liquid crystal displays, these thin film transistors are typically deposited on glass, and are typically made from amorphous silicon or polysilicon. Other electronic circuits (such as drive electronics or logic) are sometimes integrated into the periphery of the display. An emerging field is the deposition of amorphous or polysilicon devices onto flexible substrates such as metal foils or plastic films.

The addressing electronic backplane could incorporate diodes as the nonlinear element, rather than transistors. Diode-based active matrix arrays have been demonstrated as being compatible with liquid crystal displays to form high resolution devices.

There are also examples of crystalline silicon transistors being used on glass substrates. Crystalline silicon possesses very high mobilities, and thus can be used to make high performance devices. Presently, the most straightforward way of constructing crystalline silicon devices is on a silicon wafer. For use in many types of liquid crystal displays, the crystalline silicon circuit is constructed on a silicon wafer, and then transferred to a glass substrate by a "liftoff" process. Alternatively, the silicon transistors can be formed on a silicon wafer, removed via a liftoff process, and then deposited on a flexible substrate such as plastic, metal foil, or paper. As another embodiment, the silicon could be formed on a different substrate that is able to tolerate high temperatures (such as glass or metal foils), lifted off, and transferred to a flexible substrate. As yet another embodiment, the silicon transistors are formed on a silicon wafer, which is then used in whole or in part as one of the substrates for the display.

The use of silicon-based circuits with liquid crystals is the basis of a large industry. Nevertheless, these display possess serious drawbacks. Liquid crystal displays are inefficient with light, so that most liquid crystal displays require some sort of backlighting. Reflective liquid crystal displays can be constructed, but are typically very dim, due to the presence of polarizers. Most liquid crystal devices require precise spacing of the cell gap, so that they are not very compatible with flexible substrates. Most liquid crystal displays require a "rubbing" process to align the liquid crystals, which is both difficult to control and has the potential for damaging the TFT array.

The combination of these thin film transistors with microencapsulated electrophoretic displays should be even more advantageous than with liquid crystal displays. Thin film transistor arrays similar to those used with liquid crystals could also be used with the microencapsulated display medium. As noted above, liquid crystal arrays typically requires a "rubbing" process to align the liquid crystals, which can cause either mechanical or static electrical damage to the transistor array. No such rubbing is needed for microencapsulated displays, improving yields and simplifying the construction process.

Microencapsulated electrophoretic displays can be highly reflective. This provides an advantage in high-resolution displays, as a backlight is not required for good visibility. Also, a high-resolution display can be built on opaque substrates, which opens up a range of new materials for the deposition of thin film transistor arrays.

Moreover, the encapsulated electrophoretic display is highly compatible with flexible substrates. This enables high-resolution TFT displays in which the transistors are deposited on flexible substrates like flexible glass, plastics, or metal foils. The flexible substrate used with any type of thin film transistor or other nonlinear element need not be a single sheet of glass, plastic, metal foil, though. Instead, it could be constructed of paper. Alternatively, it could be constructed of a woven material. Alternatively, it could be a composite or layered combination of these materials.

As in liquid crystal displays, external logic or drive circuitry can be built on the same substrate as the thin film transistor switches.

In another embodiment, the addressing electronic backplane could incorporate diodes as the nonlinear element, rather than transistors.

In another embodiment, it is possible to form transistors on a silicon wafer, dice the transistors, and place them in a large area array to form a large, TFT-addressed display medium. One example of this concept is to form mechanical impressions in the receiving substrate, and then cover the substrate with a slurry or other form of the transistors. With agitation, the transistors will fall into the impressions, where they can be bonded and incorporated into the device circuitry. The receiving substrate could be glass, plastic, or other nonconductive material. In this way, the economy of creating transistors using standard processing methods can be used to create large-area displays without the need for large area silicon processing equipment.

While the examples described here are listed using encapsulated electrophoretic displays, there are other particle-based display media which should also work as well, including encapsulated suspended particles and rotating ball displays.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An encapsulated electrophoretic display comprising:
a full-color pixel comprising a first addressable sub-pixel and a second sub-pixel independently addressable from the first sub-pixel, wherein the first sub-pixel comprises a first electrophoretic medium comprising first particles in a suspending fluid and the second sub-pixel comprises a second electrophoretic medium comprising second particles in a suspending fluid, at least some of the second particles having a color different from the color of the first particles, each of the first and second sub-pixels being capable of displaying three colors selected from the group consisting of white, black, red, green, blue, cyan, magenta and yellow when addressed, the first sub-pixel being capable of displaying at least one color different from the colors capable of being displayed by the second sub-pixel.

2. The display of claim 1 further comprising a first color filter extending across the first sub-pixel and a second color filter extending across the second sub-pixel.

3. The display of claim 1 wherein the displaying of one color results from lateral migration of at least one of the electrophoretic particles.

4. The display of claim 1 wherein the suspending fluid of each of the first and second electrophoretic media is colored.

5. The display of claim 1 wherein the suspending fluid of each of the first and second electrophoretic media is clear.

6. The display of claim 1 further comprising a third sub-pixel comprising electrophoretic particles, the third sub-pixel being addressable independently of the first sub-pixel and the second sub-pixel, wherein the third sub-pixel comprises a third electrophoretic medium comprising third particles in a suspending fluid, at least some of the third particles having a color different from the colors of the first and second particles, the third sub-pixel being capable of displaying three colors selected from the group consisting of white, black, red, green, blue, cyan, magenta and yellow when addressed, the third sub-pixel being capable of displaying at least one color different from the colors capable of being displayed by the first sub-pixel and at least one color different from the colors capable of being displayed by the second sub-pixel.

7. The display of claim 6 further comprising a first color filter extending across the first sub-pixel, a second color filter extending across the second sub-pixel and a third color filter extending across the third sub-pixel.

8. The display of claim 6 wherein:
(a) the first sub-pixel is capable of displaying white, cyan and red;
(b) the second sub-pixel is capable of displaying white, magenta and green; and
(c) the third sub-pixel is capable of displaying white, yellow and blue.

* * * * *